(12) United States Patent  
Reiherzer

(10) Patent No.: US 8,946,747 B2
(45) Date of Patent: Feb. 3, 2015

(54) LIGHTING DEVICE INCLUDING MULTIPLE ENCAPSULANT MATERIAL LAYERS

(75) Inventor: Jesse Reiherzer, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/372,076

(22) Filed: Feb. 13, 2012

(65) Prior Publication Data

US 2013/0207141 A1 Aug. 15, 2013

(51) Int. Cl.
*H01L 33/52* (2010.01)
*H01L 33/60* (2010.01)

(52) U.S. Cl.
USPC ............ 257/98; 257/79; 257/94; 257/95; 257/99; 257/100

(58) Field of Classification Search
CPC .. H01L 33/505; H01L 33/54; H01L 2933/005
USPC ................ 257/79, 94, 95, 98, 99, 100, 257/E33.067–E33.074
See application file for complete search history.

(56) References Cited

U.S. PATENT DOCUMENTS

| | | | |
|---|---|---|---|
| 3,875,456 A | 4/1975 | Kano et al. | |
| 5,959,316 A | 9/1999 | Lowery | |
| 6,252,254 B1 | 6/2001 | Soules et al. | |
| 6,350,041 B1 | 2/2002 | Tarsa et al. | |
| 6,576,930 B2 | 6/2003 | Reeh et al. | |
| 6,936,857 B2 | 8/2005 | Doxsee et al. | |
| 7,005,679 B2 | 2/2006 | Tarsa et al. | |
| 7,183,577 B2 | 2/2007 | Mueller-Mach et al. | |
| 7,250,715 B2 | 7/2007 | Mueller et al. | |
| 7,598,669 B2 * | 10/2009 | Toguchi et al. | 313/506 |
| 7,709,853 B2 | 5/2010 | Medendorp, Jr. | |
| 2005/0045898 A1 * | 3/2005 | Leu et al. | 257/98 |
| 2006/0226759 A1 | 10/2006 | Masuda et al. | |
| 2007/0012940 A1 * | 1/2007 | Suh et al. | 257/99 |
| 2007/0223219 A1 | 9/2007 | Medendorp et al. | |
| 2008/0080165 A1 | 4/2008 | Kim et al. | |
| 2008/0308825 A1 * | 12/2008 | Chakraborty et al. | 257/98 |

(Continued)

FOREIGN PATENT DOCUMENTS

| | | |
|---|---|---|
| JP | 2001-291406 A | 10/2001 |
| JP | 2005-244226 A | 9/2005 |

(Continued)

OTHER PUBLICATIONS

Ming Ma, et al., Effects of the refractive index of the encapsulant on the light-extraction efficiency of light-emitting diodes, Optics Express, Sep. 12, 2011, pp. A1135-A1140, vol. 19, No. S5.

(Continued)

*Primary Examiner* — Matthew W Such
*Assistant Examiner* — David Spalla
(74) *Attorney, Agent, or Firm* — Withrow & Terranova, P.L.L.C.; Vincent K. Gustafson

(57) ABSTRACT

A lighting device includes an electrically activated emitter, a first layer that contains a first encapsulant material, and a second layer that contains a second encapsulant material, with a textured interface between the first layer and the second layer. Additional layers including further encapsulant materials and/or lumiphoric materials may be provided. Multiple textured interfaces may be provided. Textured interfaces may be arranged as lenses, including Fresnel lenses.

46 Claims, 8 Drawing Sheets

(56) References Cited

U.S. PATENT DOCUMENTS

| | | | |
|---|---|---|---|
| 2009/0039373 A1 | 2/2009 | LeToquin et al. | |
| 2009/0250714 A1 | 10/2009 | Yun et al. | |
| 2009/0295265 A1 | 12/2009 | Tabuchi et al. | |
| 2012/0161621 A1* | 6/2012 | Sato | 313/512 |
| 2013/0168719 A1* | 7/2013 | Watkins et al. | 257/98 |

FOREIGN PATENT DOCUMENTS

| | | | |
|---|---|---|---|
| JP | 2010-103404 A | 5/2010 | |
| WO | 2006-245443 A | 9/2006 | |
| WO | WO-2009-107052 A1 | 9/2009 | |
| WO | WO-2011109097 A1 | 9/2011 | |

OTHER PUBLICATIONS

U.S. Appl. No. 13/372,063, filed Feb. 13, 2012.

Non-Final Office Action for U.S. Appl. No. 13/372,063, mailed Jul. 28, 2014, 17 pages.

Notice of Allowance for U.S. Appl. No. 13/372,063, mailed Oct. 8, 2014, 9 pages.

* cited by examiner

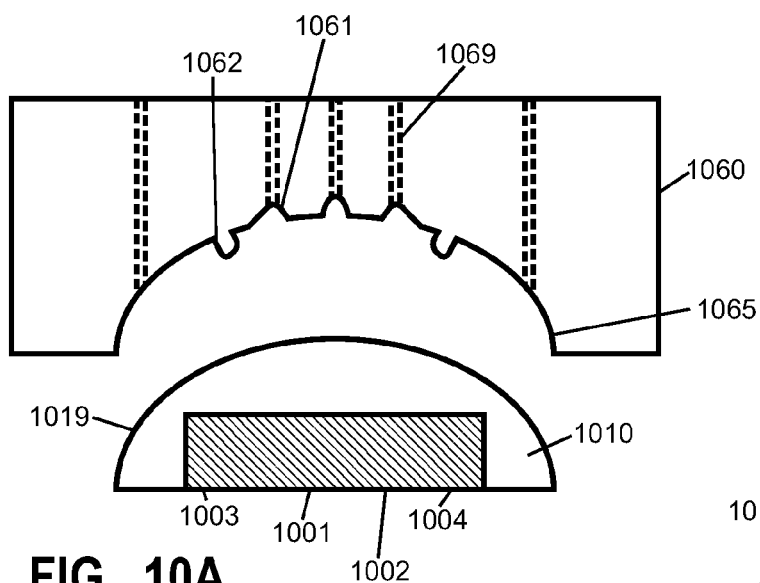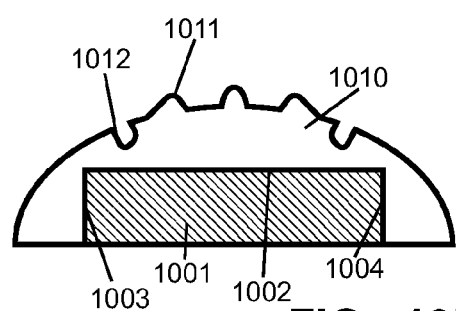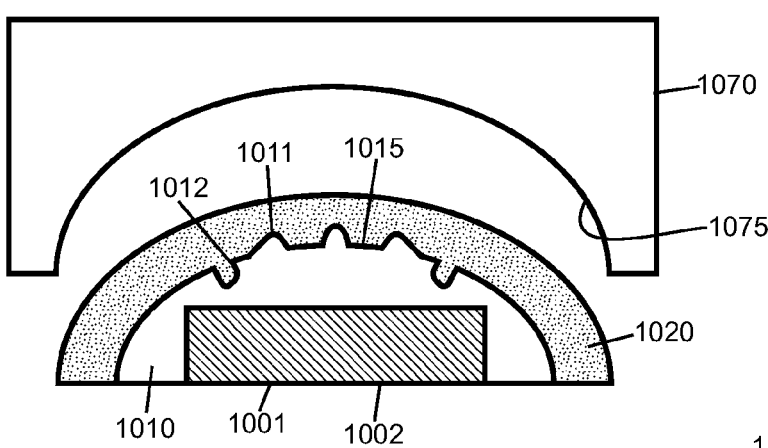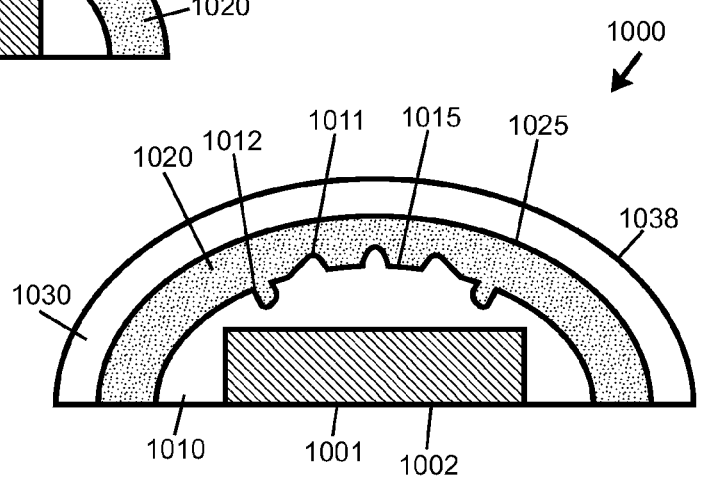
FIG. 10A
FIG. 10B
FIG. 10C
FIG. 10D

LIGHTING DEVICE INCLUDING MULTIPLE ENCAPSULANT MATERIAL LAYERS

TECHNICAL FIELD

Subject matter herein relates to electrically activated (e.g., solid state) lighting devices, including devices with multiple layers of encapsulant material arranged to transmit light generated by at least one electrically activated light emitter, and methods of making and using same.

BACKGROUND

Solid state light sources may be utilized to provide colored (e.g., non-white) or white light (e.g., perceived as being white or near-white). A solid state lighting device may include, for example, at least one organic or inorganic light emitting diode ("LED") or a laser. White solid state emitters have been investigated as potential replacements for white incandescent or fluorescent lamps due to reasons including substantially increased efficiency and longevity. Longevity of solid state emitters is of particular benefit in environments where access is difficult and/or where change-out costs are extremely high.

Because light that is perceived as white is necessarily a blend of light of two or more colors (or wavelengths), and light emitting diodes are inherently narrow-band emitters, no single light emitting diode junction has been developed that can produce white light. A representative example of a white LED lamp includes a blue LED chip (e.g., made of InGaN and/or GaN), arranged to stimulate a phosphor one or more phosphors (e.g., commonly yellow phosphors such as YAG:Ce or BOSE). A portion of the emissions of the blue LED chip pass through the phosphor, while another portion of such emissions is absorbed by the phosphor, which becomes excited and emits yellow emissions. The resulting mixture of blue and yellow light (sometimes termed 'blue shifted yellow' or 'BSY' light) may be perceived as cool white light. Various methods exist to enhance cool white light to increase its warmth, including supplementation with a red LEDs or red phosphor. Additional or different supplemental LEDs and/or phosphors (e.g., of other colors) may be used. Various methods exist for arranging lumiphoric materials (e.g., phosphors) to be stimulated by solid state emitters, including coating of one or more lumiphoric materials directly on a surface of a solid state emitter chip, or combining one or more lumiphoric materials with a binder and depositing the combination over one or more solid state emitter chips (e.g., mounted on a substrate or in a reflector cup). One or lumiphoric materials may also be associated with an optical element such as a lens that is positioned on or over a solid state emitter chip.

Various solid state lighting devices including optical elements and/or lumiphoric materials arranged in discrete layers or regions are disclosed in U.S. Patent Application Publication No. 2009/0039375 A1 to LeToquin, et al. and U.S. Pat. No. 7,709,853 to Medendorp, Jr., which are commonly assigned to the owner of the present application and are hereby incorporated by reference as if set forth fully herein. U.S. Pat. No. 7,709,853 discloses use of multiple layers of materials (e.g., silicone, epoxy, hybrid silicone/epoxy materials) having different indices of refraction. U.S. Patent Application Publication No. 2009/0039375 A1 further discloses texturing or patterning of an overlayer along an outer light emitting surface thereof in order to increase light extraction.

A technical paper by Ma, et al., Opt. Express, Vol. 19, No. S5. (September 2011), pp. A1117-A1125, entitled "Effects of the refractive index of the encapsulant on the light extraction efficiency of light-emitting diodes" ("Ma et al.") discloses use of a dual-layer graded refractive index encapsulant with a light emitting diode chip to reduce Fresnel reflection at the encapsulant/air interface (e.g., by 35% compared with a LED encapsulated with a single-layer encapsulant).

Although lighting devices including multiple encapsulant layers are known, various improvements to lighting devices including multiple encapsulant layers would be desirable. It would be desirable to enhance adhesion between such layers or regions. It would also be desirable to facilitate greater control of optical properties (including, but not limited, focus and/or directionality) of lighting devices including encapsulant materials. It would further be desirable to enhance color mixing of, and/or increase light extraction from, lighting devices including encapsulant materials. Various embodiments as disclosed herein address or more of the foregoing concerns.

SUMMARY

The present invention relates in various aspects to lighting devices including a first layer that includes a first encapsulant material and a second layer that includes a second encapsulant material, and including a textured interface between the first layer and the second layer.

In one aspect, the invention relates to a lighting device comprising: at least one electrically activated emitter; a first layer comprising a first encapsulant material overlying at least a portion of the at least one electrically activated emitter and arranged to receive emissions of the at least one electrically activated emitter; and a second layer comprising a second encapsulant material overlying at least a portion of the first layer and arranged to receive emissions of the at least one electrically activated emitter, wherein the second encapsulant material is compositionally different from the first encapsulant material; wherein an interface between the first layer and the second layer comprises at least one of the following features (i) and (ii): (i) at least one outwardly protruding portion of the first layer that includes at least one protruding portion lateral wall of the first layer arranged in contact with the second layer, wherein the at least one protruding portion of the first layer comprises a height of at least 5 micrometers; and (ii) at least one recess defined in the first layer that is bounded by at least one recess lateral wall of the first layer arranged in contact with the second layer, wherein the at least one recess defined in the first layer comprises a depth of at least 5 micrometers.

In another aspect, the invention relates to a lighting device comprising: at least one solid state emitter; a first layer comprising at least one first encapsulant material arranged to receive light generated by at least one electrically activated emitter; and a second layer comprising at least one second encapsulant material overlying the first layer and arranged to receive emissions from the first layer, wherein the second encapsulant material is compositionally different from the first encapsulant material; wherein at least one of (a) at least one surface of the first layer, and (b) a surface of the second layer proximate to the first layer, comprises at least one of the following items (i) to (iv): (i) at least one outwardly protruding portion comprising a height of at least 5 micrometers; (ii) at least one recess comprising a depth of at least 5 micrometers; (iii) at least three features that are regularly spaced relative to one another with substantially equal gaps between adjacent features, wherein the at least three features that are regularly spaced include at least one of recesses and outwardly protruding portions; and (iv) at least three features comprising regularized height or depth that include at least one of recesses and outwardly protruding portions, including variation in height or depth of less than 20% among the at least three features comprising regularized height or depth.

In another aspect, the invention relates to a method for fabricating at least one lighting device, the method comprising: depositing a first layer comprising a first encapsulant material over at least a portion of at least one electrically activated emitter, with the first encapsulant material arranged to receive emissions of the at least one electrically activated emitter; forming at least one of the following items (i) to (iv) in or on the first layer: (i) at least one outwardly protruding portion of the first layer that includes at least one protruding portion lateral wall of the first layer, wherein the at least one protruding portion of the first layer comprises a height of at least 5 micrometers; (ii) at least one recess defined in the first layer that is bounded by at least one recess lateral wall of the first layer arranged in contact with the second layer, wherein the at least one recess defined in the first layer comprises a depth of at least 5 micrometers; (iii) at least three features that are regularly spaced relative to one another with substantially equal gaps between adjacent features, wherein the at least three features include at least one of recesses in the first layer and outwardly protruding portions of the first layer; and (iv) at least three features comprising regularized height or depth that include at least one of recesses in the first layer and outwardly protruding portions of the first layer, including variation in height or depth of less than 20% among the at least three features; and depositing a second layer comprising a second encapsulant material over at least a portion of the first layer and arranged to receive emissions of the at least one electrically activated emitter.

Further aspects relating to methods of illuminating an object, a space, or an environment utilizing at least one lighting device as disclosed herein.

In another aspect, any of the foregoing aspects, and/or various separate aspects and features as described herein, may be combined for additional advantage.

Other aspects, features and embodiments of the invention will be more fully apparent from the ensuing disclosure and appended claims.

BRIEF DESCRIPTION OF THE DRAWINGS

FIGS. 9A-9E illustrate various stages of a method for producing a lighting device according to one embodiment, wherein: FIG. 9A is a top schematic view of an electrically activated emitter; FIG. 9B is a top plan schematic view of the emitter of FIG. 9A overlaid with a first layer containing a first encapsulant material; FIG. 9C is a top plan schematic view of the emitter and first layer of FIG. 9B after formation of features (e.g., recesses) in top and side surfaces of the first layer; FIG. 9D is a top plan schematic view of the emitter and first layer of FIG. 9C further overlaid with a second layer containing a second encapsulant material; and FIG. 9E is a side cross-sectional schematic view of the device of FIG. 9D.

FIGS. 10A-10D illustrate various stages of a method for producing a lighting device according to one embodiment, wherein: FIG. 10A is a side cross-sectional schematic view of an electrically activated electrically activated emitter overlaid with a first layer containing a first encapsulant material, positioned under a compression die having protrusions and recesses defined therein to define corresponding recesses and protrusions in the first layer following contact thereof; FIG. 10B is a side cross-sectional schematic view of the electrically activated electrically activated emitter and first layer of FIG. 10A following formation of protrusions and recesses in the first layer; FIG. 10C is a side cross-sectional schematic view of the emitter and first layer of FIG. 10B overlaid with a second layer including a second encapsulant material, following removal of a hemispherical die used to shape the second layer; and FIG. 10D is a side cross-sectional schematic view of the emitter, first layer, and second layer of FIG. 10C following formation of a third layer including a third encapsulant material over the second layer.

DETAILED DESCRIPTION

Figure 1:
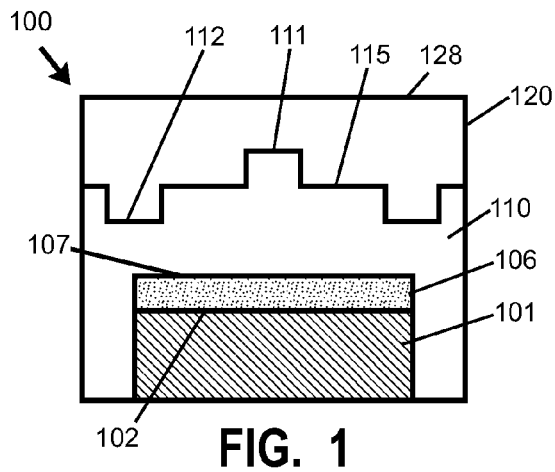
FIG. 1 is a side cross-sectional schematic view of a lighting device according to one embodiment including an electrically activated emitter overlaid with a first layer containing a first encapsulant material and a second layer containing a second encapsulant material, with a textured interface between the first layer and the second layer.

The present invention relates in certain aspects to lighting devices including multiple discrete layers comprising different lumiphoric materials arranged to receive light from at least one electrically activated emitter, and including between the discrete layers at least one textured interface including at least one outwardly protruding portion and/or at least one recess. Multiple texture interfaces may be provided. Use of one or more textured interfaces between lumiphoric material layers may be used to affect optical properties, affect color mixing, and/or enhance inter-layer adhesion. Method of fabricating and using such devices are further provided.

Unless otherwise defined, terms used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Embodiments of the invention are described herein with reference to cross-sectional, perspective, and/or plan view illustrations that are schematic illustrations of idealized embodiments of the invention. Variations from the shapes of the illustrations as a result, for example, of manufacturing techniques and/or tolerances, are to be expected, such that embodiments of the invention should not be construed as limited to particular shapes illustrated herein. This invention may be embodied in different forms and should not be construed as limited to the specific embodiments set forth herein. In the drawings, the size and relative sizes of layers and regions may be exaggerated for clarity.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "beneath" or "overlying" may be used herein to describe a relationship of one layer or region to another layer or region relative to a substrate, emitter, or another element layer as illustrated in the figures. It will be understood that these terms are intended to encompass different orientations of the device in addition to the orientation depicted in the figures. The term "directly" is utilized to mean that there are no intervening elements.

The terms "electrically activated emitter" and "emitter" as used herein refers to any device capable of producing visible or near visible (e.g., from infrared to ultraviolet) wavelength radiation, including but not limited to, xenon lamps, mercury lamps, sodium lamps, incandescent lamps, and solid state emitters, including diodes (LEDs), organic light emitting diodes (OLEDs), and lasers.

The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the invention may include III-V nitride (e.g., gallium nitride) based LEDs or lasers fabricated on a silicon carbide, sapphire, or III-V nitride substrate, including (for example) devices manufactured and sold by Cree, Inc. of Durham, N.C. Such LEDs and/or lasers may be configured to operate such that light emission occurs through the substrate in a so-called "flip chip" orientation. Such LEDs and/or lasers may also be devoid of substrates (e.g., following substrate removal).

Electrically activated light emitters (including solid state light emitters) may be used individually or in combination with one or more lumiphoric materials (e.g., phosphors, scintillators, lumiphoric inks, quantum dots) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on electrically activated light emitters (e.g., by powder coating, inkjet printing, or the like), adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphoric material-containing layer and/or an encapsulant layer.

The expression "peak wavelength", as used herein, means (1) in the case of a solid state light emitter, to the peak wavelength of light that the solid state light emitter emits if it is illuminated, and (2) in the case of a lumiphoric material, the peak wavelength of light that the lumiphoric material emits if it is excited.

A wide variety of wavelength conversion materials (e.g., luminescent materials, also known as lumiphors or luminophoric media, e.g., as disclosed in U.S. Pat. No. 6,600,175 and U.S. Patent Application Publication No. 2009/0184616), are well-known and available to persons of skill in the art. Examples of luminescent materials (lumiphors) include phosphors, scintillators, day glow tapes, nanophosphors, quantum dots (e.g., such as provided by NNCrystal US Corp. (Fayetteville, Ark.)), and inks that glow in the visible spectrum upon illumination with (e.g., ultraviolet) light. Inclusion of lumiphors in LED devices has been accomplished by providing layers (e.g., coatings) of such materials over solid state emitters and/or by dispersing luminescent materials to a clear encapsulant (e.g., epoxy-based or silicone-based curable resin or other polymeric matrix) arranged to cover one or more solid state light emitters. One or more luminescent materials useable in devices as described herein may be down-converting or up-converting, or can include a combination of both types.

In any embodiments as disclosed herein, an encapsulant material may contain one or more lumiphoric materials unless specifically indicated to the contrary. Multiple encapsulant materials arranged in series may separately contain different lumiphoric materials. When multiple encapsulant layers having different compositions (and different indices of refraction) are disposed in series, such layers are preferably arranged with materials having higher indices of refraction closer to an electrically activated emitter, and with materials having lower indices of refraction closer to a surrounding medium (e.g., air).

Various embodiments include encapsulant materials and/or lumiphoric materials and/or lumiphor support elements that are spatially segregated (i.e., remotely located) from one or more electrically activated emitters. In certain embodiments, such spatial segregation may involve separation of a distance of at least about 1 mm, at least about 2 mm, at least about 5 mm, or at least about 10 mm. Lumiphoric materials may be supported by or within one or more lumiphor support elements, such as (but not limited to) glass layers or discs, polymeric material layers, optical elements, or layers of similarly translucent or transparent materials capable of being coated with, or including (e.g., embedded) therein, lumiphoric material. In certain embodiments, lumiphoric material may be embedded or dispersed in a lumiphor support element.

Some embodiments of the present invention may use solid state emitters, emitter packages, fixtures, luminescent materials/elements, power supplies, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; with the disclosures of the foregoing patents and published patent applications being hereby incorporated by reference as if set forth fully herein.

The expression "lighting device", as used herein, is not limited, except that it is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or backlighting (e.g., backlight poster, signage, LCD displays), bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting-work lights, etc., mirrors/vanity lighting, or any other light emitting device.

The inventive subject matter further relates in certain embodiments to an illuminated enclosure (the volume of which can be illuminated uniformly or non-uniformly), comprising an enclosed space and at least one lighting device as disclosed herein, wherein the lighting device illuminates at least a portion of the enclosure (uniformly or non-uniformly). The inventive subject matter further relates to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, a LCD display, a cave, a tunnel, a yard, a lamppost, etc., having mounted therein or thereon at least one lighting device as described herein.

In certain embodiments, lighting devices as described herein including at least one electrically activated (e.g., solid state) emitter with a peak wavelength in the visible range. In certain embodiments, multiple electrically activated (e.g., solid state) emitters are provided, with such emitters optionally being independently controllable. In certain embodiments, lighting devices as described herein include a first LED comprising a first LED peak wavelength, and comprises a second LED comprising a second LED peak wavelength that differs from the first LED peak wavelength by at least 20 nm. In such a case, each of the first wavelength and the second wavelength is preferably within the visible range.

Certain embodiments of the present invention relate to use of solid state emitter packages. A solid state emitter package typically includes at least one solid state emitter chip that is enclosed with packaging elements to provide environmental and/or mechanical protection, color selection, and light focusing, as well as electrical leads, contacts, and/or traces enabling electrical connection to an external circuit. Encapsulant materials, optionally including lumiphoric material, may be disposed over solid state emitters, lumiphoric materials, and/or lumiphor-containing layers in a solid state emitter package. Multiple solid state emitters may be provided in a single package. A package including multiple solid state emitters may include at least one of the following features: a single leadframe arranged to conduct power to the solid state emitters, a single reflector (e.g., a reflector cup) arranged to reflect at least a portion of light emanating from each solid state emitter, a single submount supporting each solid state emitter, and a single lens arranged to transmit at least a portion of light emanating from each solid state emitter.

Individual emitters in a solid state emitter package, or groups of emitters (e.g., wired in series) in a solid state emitter package, may be separately controlled. Multiple solid state emitter packages may be arranged in a single solid state lighting device. Individual solid state emitter packages or groups of solid state emitter packages (e.g., wired in series) may be separately controlled. Separate control of individual emitters, groups of emitters, individual packages, or groups of packages, may be provided by independently applying drive currents to the relevant components with control elements known to those skilled in the art. In one embodiment, at least one control circuit a may include a current supply circuit configured to independently apply an on-state drive current to each individual solid state emitter, group of solid state emitters, individual solid state emitter package, or group of solid state emitter packages. Such control may be responsive to a control signal (optionally including at least one sensor arranged to sense electrical, optical, and/or thermal properties and/or environmental conditions), and a control system may be configured to selectively provide one or more control signals to the at least one current supply circuit. In various embodiments, current to different circuits or circuit portions may be pre-set, user-defined, or responsive to one or more inputs or other control parameters.

Certain embodiments of the present invention further relate to the use of light fixtures include multiple electrically activated (e.g., solid state) emitters as disclosed herein. Multiple emitters may be arranged on a single substrate and/or mounting plate, whether individually or as part of multi-chip packages or other multi-chip lamps. Any desirable number of electrically activated emitters may be incorporated into a light fixture. Each electrically activated emitter or emitter-containing package in a single fixture may be substantially identical to one another, or emitters (or emitter-containing packages) with different output characteristics may be intentionally provided in a single light fixture. A light fixture may include one or more control circuits arranged in electrical communication with electrically activated emitters and/or emitter packages contained in or supported by the fixture.

As noted previously, embodiments of the invention relate to lighting devices including discrete layers of compositionally different encapsulant materials, wherein at least one surface of at least one of the discrete layers (e.g., along an interface between discrete layers) includes textured features such as at least one outwardly protruding portion and/or at least one recess. At least one protruding portion and/or at least one recess has a height or depth of preferably at least about 3 micrometers, or at least about 5 micrometers, or preferably at least about 10 micrometers, or preferably at least about 15 micrometers, or preferably at least about 20 micrometers. In certain embodiments, recesses do not penetrate or extend through the entire thickness of an encapsulant material layer. In certain embodiments, protrusions and/or recesses defined on or in an encapsulant layer have regularized height or depth, such as with a variation in height or depth of preferably less than about 30%, more preferably less than about 20%, and still more preferably less than about 10% among multiple (or substantially all) protrusions and/or recesses defined on or in such a layer. In various embodiments as disclosed herein, a protrusion extending outward from an underlying layer corresponds to a recess defined in an overlying layer.

Examples of compositionally different encapsulant materials include but are not limited to methyl-based silicones, phenyl-based silicones, methyl/phenyl-based silicones, various epoxies, other polymers, and combinations of the foregoing materials with or without additives such as light scattering materials (e.g., titanium dioxide or silicon dioxide particles), diffusing elements, or polarizing elements, with any one or more of the foregoing elements being arrangeable as a sublayer, interlayer, or coating. Certain types of epoxies tend to brown with age and/or exposure to light and heat; as a result, in certain embodiments silicone materials are preferred. In certain embodiments, encapsulant material layers have different indices of refraction relative to one another, and are arranged from a higher index of refraction proximate to an electrically activated light emitter (or lumiphoric material associated with an electrically activated light emitter) to a lower index of refraction proximate to a surrounding medium (e.g., air or optical elements). Among various types of silicones, phenyl-based silicones have a higher index of refraction, methyl-based silicones have a lower index of refraction, and combined methyl/phenyl based silicones have indices of refraction between the values for phenyl-based and methyl-based silicones. In certain embodiments, encapsulant materials used in different layers as described herein have different indices of refraction relative to one another. In certain embodiments, compositional differences between layers (e.g., encapsulant material layers) are attributable at least in part to presence or absence of light scattering materials. For example, at least one of a first encapsulant material layer and a second encapsulant material layer may include at least one light scattering material, wherein at least one of presence, concentration, amount, average particle size, and distribution of the at least one light scattering material differs between the first (encapsulant) layer and the second (encapsulant) layer.

Protrusions and recesses in discrete encapsulant material layers may be formed by various methods including, but not limited to: compression molding to shape portions of a layer; blade cutting to effectuate removal of a portion of a layer; cutting with pressurized fluid (e.g., liquid or gas) to effectuate removal of a portion of a layer; laser ablation (e.g., supplying laser energy to a layer to effectuate removal of a portion of the layer); chemical removal and/or etching (e.g., supplying a chemical reactant to a layer to effectuate removal of a portion of the layer); and selective deposition (e.g., via liquid jetting, electrophoresis, localized insertion of solids, or the like). In various embodiments, a mask may be applied over at least a portion of a layer, and material and/or energy may be supplied to the layer through one or more openings defined in the mask to effectuate selective curing and/or removal of portions of a layer. In certain embodiments, materials used to form one or more layers may be applied in liquid or gel form, then at least partially cured (e.g., hardened) by application of heat, light, and/or chemical reactants, followed by definition of one or more textural features (e.g., protrusions and/or recesses) by selective removal of portions of the at least partially cured layer.

In certain embodiments, protrusions and/or recesses may be regularly spaced or arranged in or on an encapsulant layer. In various embodiments, protrusions and/or recesses may include side walls that are substantially perpendicular, or are non-perpendicular (e.g., angled at an obtuse angle), relative to a light emitting (e.g., upper) surface of an electrically activated emitter, or relative to a plane extending through an average or nominal height of an encapsulant layer. Protrusions and/or recesses as described herein may be provided in any suitable number and shapes on or in an encapsulant layer, including (but not limited to) cross-sectional shapes having sawtooth, interrupted sawtooth, truncated sawtooth, square wave, interrupted square wave, sinusoidal, and other shapes. In certain embodiments, protrusions and/or recesses may be arranged as parallel or intersecting straight or curved ridges, grooves, or stripes. Protruding portions (protrusions) and recesses as described herein may also be formed as unconnected geometric shapes, connected geometric shapes, or arrays of discrete protrusions and/or recesses of any desired shapes or conformation. In certain embodiments, protrusions and/or recesses may be concentrically arranged. In certain embodiments, protrusions and/or recesses may be arranged in a two-dimensional array with regular spacing between textural features. In one embodiment, a two-dimensional array includes elements arranged in checkerboard manner. In certain embodiments, an encapsulant layer includes at least three outwardly protruding portions, with substantially equal gaps (e.g., equal length gaps) between adjacent outwardly protruding portions. In certain embodiments, an encapsulant layer includes at least three recesses, with substantially equal gaps between adjacent recesses.

A textured interface between encapsulant layers of a lighting device as described herein may include multiple protrusions that differ in height relative to one another, multiple recesses that differ in depth relative to one another, and/or protrusions of the same or different heights in combination with recesses of the same or different depths. In certain embodiments, protruding portions of a first encapsulant layer may extend through an intermediate layer (e.g., lumiphoric material-containing layer, transreflective layer, or the like) to contact a second encapsulant layer arranged over the intermediate layer. In certain embodiments, protruding portions of a first encapsulant layer may extend through an adjacent second encapsulant layer into contact with either a third encapsulant layer or a lumiphoric material-containing layer (such that a lateral wall of one or more protrusions is in contact with both a second encapsulant layer and either a third encapsulant layer or a lumiphoric material-containing layer. In certain embodiments, recesses defined in a first encapsulant layer may be partially filled with a second encapsulant layer and thereafter filled with a third encapsulant layer, such that a lateral wall of one or more recesses is in contact with both a second encapsulant layer and a third encapsulant layer.

In certain embodiments, a first textured interface is provided between first and second encapsulant layers, and a second textured interface between second and third encapsulant layers of a lighting device, with each textured interface including at least one outwardly protruding portion having a height of at least 5 micrometers and/or at least one recess having a depth of at least 5 microns (or greater height/depth thresholds as recited herein). Each of the first, second, and third encapsulant materials may be compositionally different.

In certain embodiments, at least one of a first encapsulant layer and a second encapsulant layer (with a textured interface therebetween) comprises at least one lumiphoric material. Multiple lumiphoric materials may be provided in any one encapsulant layer, and/or different encapsulant layers may include different lumiphoric materials.

In certain embodiments, a layer containing lumiphoric material may include discrete subregions including lumiphoric materials with different concentrations and/or compositionally different lumiphoric materials. Such subregions may abut one another or be laterally spaced apart from one another. In certain embodiments, a first encapsulant layer may include multiple recesses defined therein, with different recesses being filled with compositionally different lumiphoric materials. A second encapsulant material may be further provided overlying the first encapsulant layer and lumiphoric material containing regions.

In certain embodiments, an encapsulant layer may be continuous in character and devoid of unconnected segments. In other embodiments, an encapsulant layer may be discontinuous in character, with at least two segments not in contact with one another. In certain embodiments, a first encapsulant layer overlies an entirety of at least one electrically activated emitter and/or a lumiphoric material layer arranged to be stimulated by an electrically activated emitter. In certain embodiments, a second encapsulant layer overlies an entirety of a first encapsulant layer. In other embodiments, a first encapsulant layer overlies only selected portions (i.e., less than an entirety) of an electrically activated emitter and/or a lumiphoric material layer, and/or a second encapsulant layer overlies only selected portions (i.e., less than an entirety) of a first encapsulant layer.

In certain embodiments, one or more encapsulant layers include a textured interface with an average height or depth arranged along a single plane. In other embodiments, one or more encapsulant layers include a textured interface with an average height or depth arranged along a multiple planes, such as (but not limited to) a curvilinear or hemispherical configuration. In certain embodiments, a lighting device including discrete encapsulant layers as described herein comprises a substantially flat light emitting outer surface; in other embodiments, a lighting device comprises a curvilinear or hemispherical light emitting outer surface.

In certain embodiments, at least one surface of a first encapsulant layer and/or a second encapsulant layer is arranged as a lens, such as a collimating lens, a focusing lens, a diverging lens, or a Fresnel lens (e.g., focusing or diverging in character). In certain embodiments, a single lighting device may include encapsulant layers defining multiple lenses arranged in series.

In certain embodiments, encapsulant layers may be applied to or over an electrically activated (e.g., solid state) emitter and/or a lumiphoric material arranged to receive emissions from an electrically activated emitter, prior to or after mounting of the electrically activated emitter on a support surface (e.g., reflector, submount, or other substrate). In certain embodiments, encapsulant layers may be applied over at least portions of one or more electrically activated emitters previously arranged within a cavity or space bounded by at least one lateral bounding element, such as a dam wall and/or reflector cup wall, with edge portions of the encapsulant layers contacting at least one wall of the lateral bounding element(s). That is, at least one electrically activated emitter may be arranged within a cavity or space bounded by at least one lateral bounding element, and discrete encapsulant layers may be applied over the at least one emitter.

In certain embodiments, a first encapsulant layer is arranged to receive light from at least one electrically activated emitter and/or a lumiphoric material, a second encapsulant layer is arranged to overlie the first layer (e.g., to receive emissions transmitted through the first layer), wherein at least one of (a) at least one surface of the first layer (e.g., inner (bottom) or outer (top) surface), and (b) a surface of the second layer proximate to the first layer (e.g., inner (bottom) surface), comprises at least one of the following features (i) and (ii): (i) at least one outwardly protruding portion comprising a height of at least 5 micrometers; and (ii) at least one recess comprising a depth of at least 5 micrometers. Textured features on one or more surfaces may comprise at least one lens, such as Fresnel lens and/or a collimating, converging, or diverging lens. In certain embodiments, the first layer is arranged in contact with the second layer. In certain embodiments, the second layer constitutes a light-emitting surface (or light emitting end) of the lighting device. In certain embodiments, the first layer is arranged in contact with at least one electrically activated emitter. In certain embodiments, the first layer is arranged in contact with at least one lumiphoric material-containing layer. In certain embodiments, the first layer is spatially segregated from the at least one electrically activated emitter and/or lumiphoric material-containing layer, such as by an intervening gap or an intervening material. Such a gap may reduce conductive thermal communication between an electrically activated emitter and a lumiphoric material, thereby potentially reducing thermal degradation of the lumiphoric material and/or improving output color stability of the lighting device. In certain embodiments, layers containing lumiphoric materials may be spatially segregated from at least one electrically activated emitter by an air gap. For example, in any embodiment disclosed herein describing presence of three or more encapsulant material layers, a first (or subsequent) encapsulant layer may be eliminated and replaced with a gap that is devoid of material.

In certain embodiments, a method for fabricating a lighting device includes depositing a first layer comprising a first encapsulant material over at least a portion of at least one electrically activated emitter; forming at least one of (i) at least one outwardly protruding feature on the first layer having a height of at least 5 micrometers (or another height threshold as recited herein) and/or (ii) at least one recess in the first layer having a depth of at least 5 micrometers (or another depth threshold as recited herein) in the first layer; and depositing a second layer including at least one second encapsulant material over at least a portion of the first layer. In certain embodiments, the forming step includes applying a compression mold to the first layer, at least partially curing the first layer, and removing the mold, prior to deposition of the second layer. In certain embodiments, the first layer may be applied in liquid or gel form, and at least partially cured prior to the forming step. Any method for forming features in or on a layer as disclosed herein may be used after partial curing (e.g., including but not limited to fluid shaping or cutting, blade cutting, laser shaping or cutting, chemical removal, and the like).

Lighting devices according to certain embodiments may include multiple encapsulant layers with at least one textured interface arranged over portions of or all of one surface of an electrically activated emitter (or a lumiphoric material-containing layer arranged to receive emissions from an electrically activated emitter), or over portions of or all of multiple surfaces of an electrically activated emitter (or a lumiphoric material-containing layer arranged to receive emissions from an electrically activated emitter).

FIGS. 1-6 illustrate electrically activated emitters each having an associated (optional) lumiphoric material, with an upper surface that is overlaid by multiple layers including different encapsulant materials. Although not illustrated in FIGS. 1-6, it is to be appreciated that multiple encapsulant material layers may be arranged over more than one surface (e.g., side walls and upper surfaces) of an electrically activated emitter, and lumiphoric material may be selectively arranged (e.g., deposited or removed) along one or more portions of at least one surface of an electrically activated emitter without being arranged over all portions of the at least one surface.

FIG. 1 is a side cross-sectional schematic view of a lighting device 100 according to one embodiment including an electrically activated emitter 101 (and optional lumiphoric material layer 106 arranged on or over at least a portion of a top surface 102 of the emitter 101) that is overlaid along at least an upper surface thereof (e.g., along upper surface 107 of the lumiphoric material layer 106) with a first layer 110 containing a first encapsulant material and overlaid with a second layer 120 containing a second encapsulant material. Preferably, the first encapsulant material and the second encapsulant material are compositionally different, with the first encapsulant material preferably having a higher index of refraction than the second encapsulant material. A textured interface 115 between the first layer 110 and the second layer 120 includes protruding portions 111 of the first layer 110 (extending into the second layer 120) and recesses 112 defined in the first layer 110. The foregoing protruding portions 111 of the first layer 110 correspond to recesses defined in a lower surface of the second layer 120, and the recesses 112 defined in the first layer 110 correspond to inwardly protruding portions of the second layer 120. The protruding portions 111 and recesses 112 include lateral walls that are substantially perpendicular to an upper surface 102 of the emitter 101, and are substantially perpendicular to an average or nominal height of the first layer along interface 115 between the first layer 110 and the second layer 120. As illustrated in FIG. 1, the cross-sectional shape of each protrusion 111 and recess 112 is rectangular. In operation of the device 100, light may be generated by the emitter 101, optionally at least partially converted to at least one different wavelength via the optional lumiphoric material layer 106, and transmitted into the first layer 110. Light transmitted through the first layer 110 is further transmitted into the second layer 120, and with light transmitted through and/or emitted by the second layer being transmitted through an upper surface 128 of the device 100, with the surface 128 optionally embodying a light emitting end of the device 100. Additional layers (e.g., additional lumiphoric material containing layers, further encapsulant materials, and/or lenses) may be optionally arranged over the first layer 110 and/or the second layer 120 in further embodiments. Aggregated emissions may include emissions of the emitter 101 and/or at least one lumiphoric material (possibly multiple lumiphoric materials) of the optional lumiphoric material layer 106.

Figure 2:
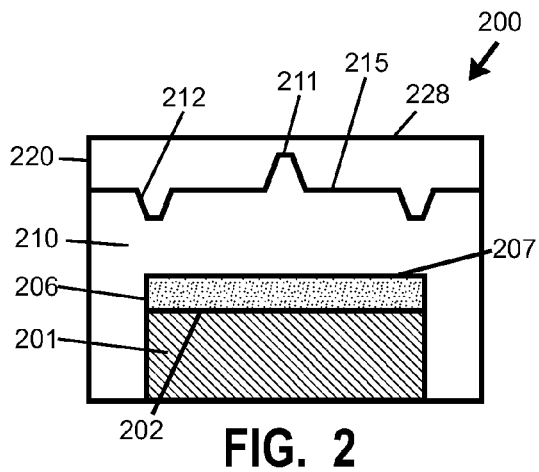
FIG. 2 is a side cross-sectional schematic view of a lighting device according to one embodiment including an electrically activated emitter overlaid with a first layer containing a first encapsulant material and a second layer containing a second encapsulant material, with a textured interface between the first layer and the second layer.

FIG. 2 is a side cross-sectional schematic view of a lighting device 200 according to one embodiment including an electrically activated emitter 201 (having an associated (optional) lumiphoric material layer 206 arranged on at least a top surface 202 of the emitter 201) that is overlaid along at least an upper surface thereof (e.g., along upper surface 207 of the optional lumiphoric material layer 206) with a first layer 210 containing a first encapsulant material and overlaid with a second layer 220 containing a second encapsulant material. Preferably, the first encapsulant material and the second encapsulant material are compositionally different, with the first encapsulant material preferably having a higher index of refraction than the second encapsulant material. A textured interface 215 between the first layer 210 and the second layer 220 includes protruding portions 211 (extending into the second layer 220) and recesses 212. Each of the protruding portions 211 and recesses 212 includes lateral walls that contact the second layer 220 and that are non-perpendicular to an upper surface 202 of the emitter 201. As illustrated in FIG. 2, the cross-sectional shape of each protrusion 211 and recess 212 is trapezoidal (i.e., forming a truncated triangle). An upper surface 228 of the second layer 220 may constitute a light emitting end of the device 200. Additional layers (e.g., additional lumiphoric material containing layers, further encapsulant materials, and/or lenses, not shown) may be optionally arranged over the first layer 210 and/or the second layer 220 in further embodiments.

Figure 3:
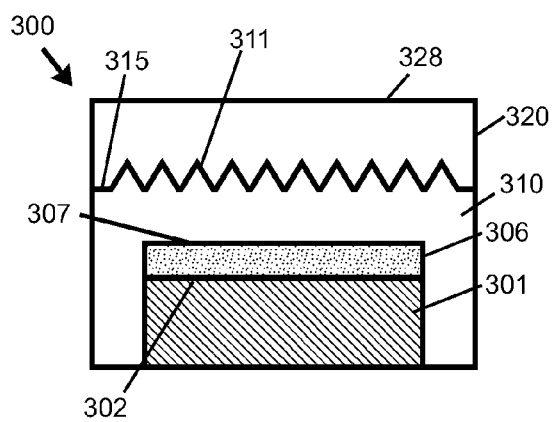
FIG. 3 is a side cross-sectional schematic view of a lighting device according to one embodiment including an electrically activated emitter overlaid with a first layer containing a first encapsulant material and a second layer containing a second encapsulant material, with a textured interface between the first layer and the second layer.

FIG. 3 is a side cross-sectional schematic view of a lighting device 300 according to one embodiment including an electrically activated emitter 301 (and optional lumiphoric material layer 306 arranged over at least a portion of a top surface 302 of the emitter 301) that is overlaid along at least an upper surface thereof (e.g., along upper surface 307 of the optional lumiphoric material layer 306) with a first layer 310 containing a first encapsulant material and a second layer 320 containing a second encapsulant material. A textured interface 315 between the first layer 310 and the second layer 320 includes protruding portions 311 of the first layer 310 (extending into the second layer 320) with lateral walls that contact the second layer 320 and that are non-perpendicular to an upper surface 302 of the emitter 301. As illustrated in FIG. 3, the cross-sectional shape of each protrusion 311 is triangular, forming a sawtooth-shaped interface between the first layer 310 and second layer 320. An upper surface 328 of the second layer 320 may constitute a light emitting end of the device 300. Additional layers (e.g., additional lumiphoric material containing layers, further encapsulant material layers, and/or lenses, not shown) may be optionally arranged over the first layer 210 and/or the second layer 220 in further embodiments.

Figure 4:
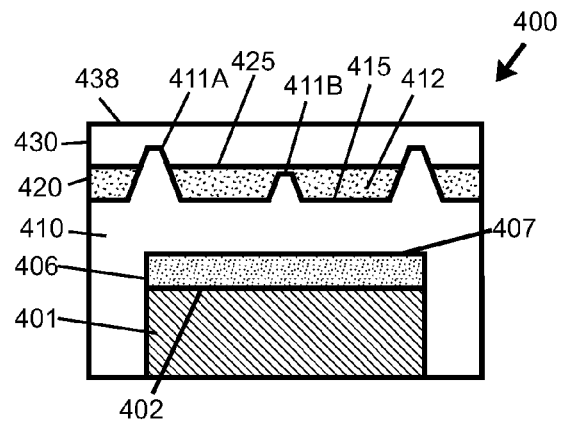
FIG. 4 is a side cross-sectional schematic view of a lighting device according to one embodiment including an electrically activated emitter overlaid with a first layer containing a first encapsulant material, a second layer containing a second encapsulant and at least one lumiphoric material, and a third layer containing a third encapsulant material, with a textured interface between the first layer and the second layer, wherein the textured interface includes protruding portions of the first layer of different heights including protrusions extending from the first layer through the second layer into the third layer.

FIG. 4 is a side cross-sectional schematic view of a lighting device 400 according to one embodiment including an electrically activated emitter 401 (and optional lumiphoric material layer 406 arranged on or over at least a portion of a top surface 402 of the emitter 401) that is overlaid along at least an upper surface thereof (e.g., along upper surface 407 of the lumiphoric material layer 406) with a first layer 410 containing a first encapsulant material, overlaid with a second layer 420 containing a second encapsulant material and optionally containing at least one lumiphoric material, and further overlaid with a third layer 430 containing a third encapsulant material. Preferably, the first, second, and third encapsulant materials are compositionally different, with the first, second, and third encapsulant material preferably having index of refraction values that decline from the first to the second encapsulant material, and further decline from the second to the third encapsulant material. A textured interface 415 between the first layer 410 and the second layer 420 includes protrusions 411A, 411B of different heights. A lateral gap extending between the taller protrusions 411A (and including a shorter protrusion 411B therein) may be considered a recess 412, with lateral walls of the taller protrusions 411A arranged in contact with both the second layer 420 and the third layer 430. In other words, a lower portion of each recess 412 is filled with the second layer 420, and an upper portion of each recess 412 is filled with the third layer 430. Each of the protruding portions 411A, 411B is trapezoidal in shape, forming a truncated triangle, with lateral walls being angled non-perpendicular to the upper surface of the electrically activated emitter 401. Materials such as lumiphors, scattering particles, anti-reflective layers, and the like may optionally be added to one or more of the encapsulant layers 410, 420, 430. An upper surface 448 of the encapsulant layer 440 may constitute a light emitting end of the device 400. Additional layers (e.g., additional lumiphoric material containing layers, further encapsulant material layers, and/or lenses, not shown) may be optionally arranged over any of the first, second, and/or third layer 410, 420, 430 in further embodiments.

Figure 5:
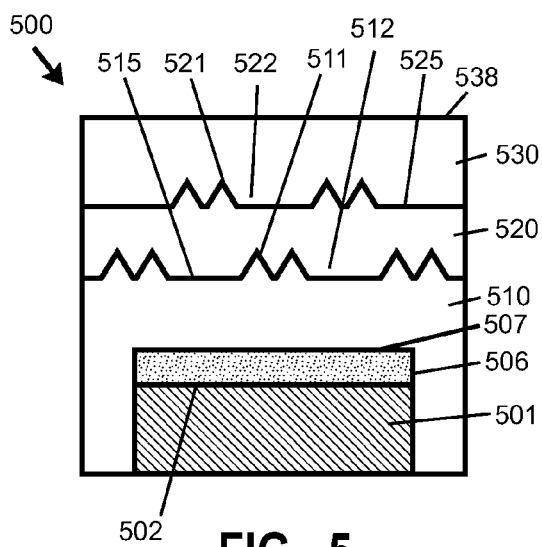
FIG. 5 is a side cross-sectional schematic view of a lighting device according to one embodiment including an electrically activated emitter overlaid with a first layer containing a first encapsulant material, a second layer containing a second encapsulant material, and a third layer containing a third encapsulant material, with a textured interface between the first layer and the second layer, and another textured interface between the second layer and the third layer.

FIG. 5 is a side cross-sectional schematic view of a lighting device 500 according to one embodiment including an electrically activated emitter 501 (and optional lumiphoric material layer 406 arranged over at least a portion of a top surface 502 of the emitter 501) that is overlaid along an upper surface 502 thereof with a first layer 510 containing a first encapsulant material, overlaid with a second layer 520 containing a second encapsulant material, and overlaid with a third layer 530 containing a third encapsulant material. Preferably, the first, second, and third encapsulant materials are compositionally different, with the first, second, and third encapsulant material preferably having index of refraction values that decline from the first to the second encapsulant material, and further decline from the second to the third encapsulant material. One textured interface 515 including protruding portions 511 (extending into the second layer 520) is arranged between the first layer 510 and the second layer 520, and another textured interface 525 including protruding portions 521 (extending into the third layer 530) is arranged between the second layer 520 and the third layer 530. The protruding portions 511, 521 are triangular in shape with lateral walls being non-perpendicular to the upper surface 502 of the emitter 501, and each textured interface 515, 525 embodies an interrupted sawtooth shape in cross-section. As shown in FIG. 5, gaps 512 are provided between groups of protrusions 511 extending from the first layer 510, and gaps 522 are provided between groups of protrusions 521 extending from the second layer 520, with the protruding portions 511 of the first layer 510 being offset from (i.e., not aligned with) protruding portions 512 of the second layer 520. An upper surface 538 of the third layer 530 may constitute a light emitting end of the device 500. Additional layers (e.g., additional lumiphoric material containing layers, further encapsulant material layers, and/or lenses, not shown) may be optionally arranged over any of the first, second, and/or third layer 510, 520, 530 in further embodiments.

Figure 6:
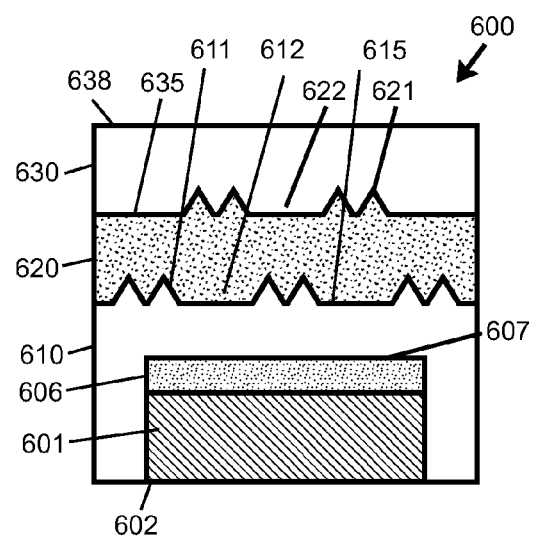
FIG. 6 is a side cross-sectional schematic view of a lighting device according to one embodiment including an electrically activated emitter overlaid with a first layer containing a first encapsulant material, a second layer containing a second encapsulant material and a lumiphoric material, and a third layer containing a third encapsulant material, with a textured interface between the first layer and the second layer, and another textured interface between the second layer and the third layer.

FIG. 6 is a side cross-sectional schematic view of a lighting device 600 according to one embodiment including an electrically activated emitter 601 (and optional lumiphoric material layer 606 arranged over at least a portion of a top surface 602 of the emitter 601) that is overlaid along an upper surface 602 thereof (e.g., along upper surface 607 of the lumiphoric material layer 606) with a first layer 610 containing a first encapsulant material, overlaid with a second layer 620 containing a second encapsulant material and optionally at least one lumiphoric material, and overlaid with a third layer 630 containing a third encapsulant material. Preferably, the first, second, and third encapsulant materials are compositionally different, with the first, second, and third encapsulant material preferably having index of refraction values that decline from the first to the second encapsulant material, and further decline from the second to the third encapsulant material. One textured interface 615 (including protruding portions 611 of the first layer 610) is provided between the first layer 610 and the second layer 620, and another textured interface (including protruding portions 621 of the second layer 620) is provided between the second layer 620 and the third layer 630. In each textured interface 615, 625, groups of protruding portions 611, 621 are separated laterally by gaps 612, 622. The protruding portions 611, 621 are triangular in shape with lateral walls being non-perpendicular to an upper surface 602 of the emitter 601. Each textured interface 615, 625 embodies an interrupted sawtooth shape in cross-section. An upper surface 628 of the second layer 620 may constitute a light emitting end of the device 600. Additional layers (e.g., additional lumiphoric material containing layers, further encapsulant material layers, and/or lenses, not shown) may be optionally arranged over any of the first, second, and/or third layer 610, 620, 630 in further embodiments.

Figure 7:
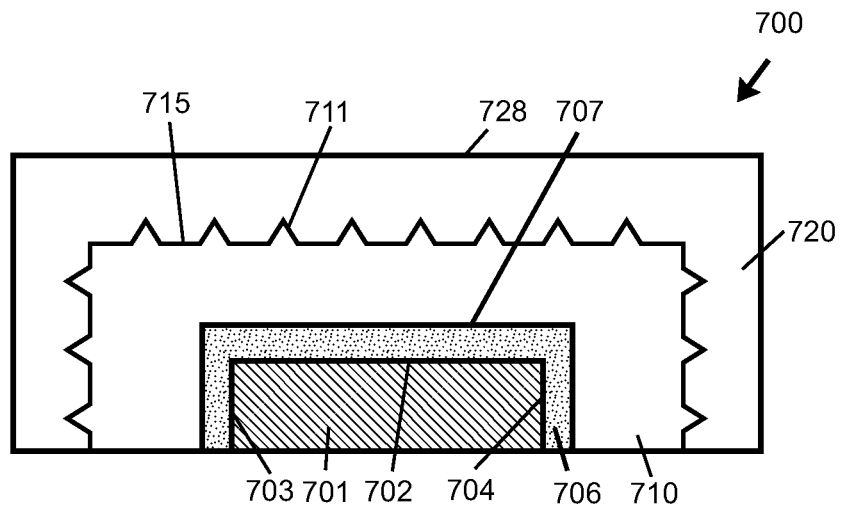
FIG. 7 is a side cross-sectional schematic view of a lighting device according to one embodiment including an electrically activated emitter overlaid with a first layer containing a first encapsulant material extending over a top surface and side walls of the emitter, and a second layer containing a second encapsulant material extending over a top surface and side walls of the first layer, including textured surfaces between the first layer and the second layer.

In certain embodiments, an electrically activated emitter may be overlaid over multiple surfaces thereof with multiple encapsulant layers. For instance, FIG. 7 is a side cross-sectional schematic view of a lighting device 700 according to one embodiment including an electrically activated emitter 701 (and an optional lumiphoric material-containing layer 706 having an outer surface 707) overlaid with a first layer 710 containing a first encapsulant material extending over a top surface 702 and side walls 703, 704 of the emitter 701, and overlaid with a second layer 720 containing a second encapsulant material extending over (e.g., over a top surface 702 and side walls 703, 704 of) the first layer 701. Preferably, the first encapsulant material and the second encapsulant material are compositionally different, with the first encapsulant material preferably having a higher index of refraction than the second encapsulant material. The device 700 includes a textured interface 715 between the first layer 710 and the second layer 720 with outwardly protruding portions 711 of the first layer 710 extending into the second layer 720, and with lateral walls of the protruding portions 711 in contact with the second layer 720. An upper surface 728 of the second layer 720 may constitute a light emitting end of the device 700. Additional layers (e.g., additional lumiphoric material containing layers, further encapsulant material layers, and/or lenses, not shown) may be optionally arranged over any of the first, second, and/or third layer 710, 720, 730 in further embodiments.

Figure 8:
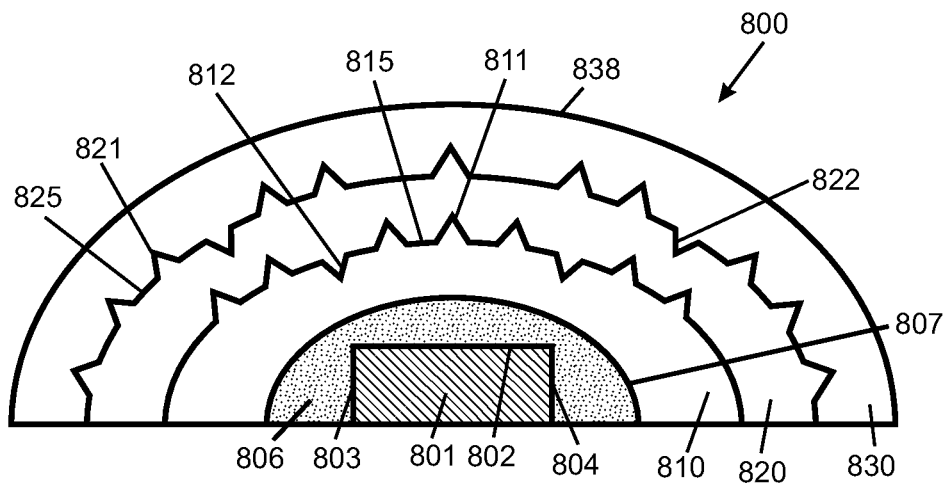
FIG. 8 is a side cross-sectional schematic view of a lighting device according to one embodiment including an electrically activated emitter overlaid with a hemispheric first layer containing a first encapsulant material extending over a top surface and side walls of the emitter, a hemispherical second layer containing a second encapsulant material extending over the first layer, and a hemispherical third layer including a third encapsulant material extending over the second layer, with a textured surface between the first layer and the second layer, and including another textured surface between the second layer and the third layer.

In certain embodiments, an electrically activated emitter may be overlaid by hemispherical layers. For instance, FIG. 8 is a side cross-sectional schematic view of a lighting device 800 according to one embodiment including an electrically activated emitter 801 (and an optional hemispherical and lumiphoric material-containing layer 806 having an outer surface 807) overlaid with a hemispherical first layer 810 containing a first encapsulant material extending over the emitter 801, overlaid with a hemispherical second layer 820 containing a second encapsulant material extending over the first layer 810, and overlaid with a hemispherical third layer 830 containing a third encapsulant material extending over the second layer 820. Preferably, the first, second, and third encapsulant materials are compositionally different, with the first, second, and third encapsulant material preferably having index of refraction values that decline from the first to the second encapsulant material, and further decline from the second to the third encapsulant material. One textured interface 815, including protruding portions 811 of the first layer 810 and recesses 812 defined in the first layer 810, is arranged between the first layer 810 and second layer 820. Another textured interface 825, including protruding portions 821 of the second layer 820 and recesses 822 defined in the second layer 820, is arranged between the second layer 820 and the third layer 830. An outer surface 838 of the third layer 840 may constitute a light emitting outer surface of the device 800. Additional layers (e.g., additional lumiphoric material containing layers, further encapsulant material layers, and/or lenses, not shown) may be optionally arranged over any of the first, second, and/or third layer 710, 720, 730 in further embodiments. Additional layers (e.g., additional lumiphoric material containing layers, further encapsulant material layers, and/or lenses, not shown) may be optionally arranged over any of the first, second, and/or third layer 810, 820, 830 in further embodiments.

Figure 9A:
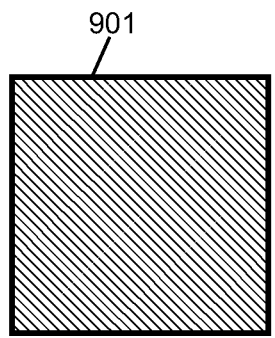
Figure 9B:
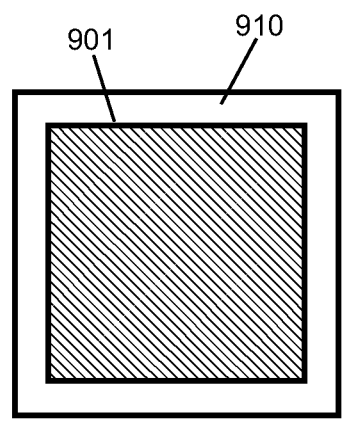
Figure 9C:
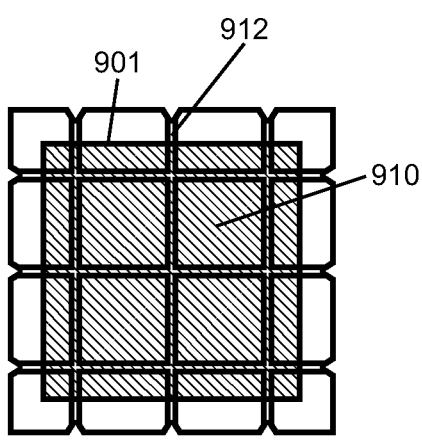

FIGS. 9A-9E illustrate various stages of a method for producing a lighting device 900 according to one embodiment. FIG. 9A is a top schematic view of an electrically activated emitter 901. FIG. 9B is a top plan schematic view of the emitter 901 of FIG. 9A overlaid with a first layer 910 containing a first encapsulant material. Although FIG. 9B illustrates the lateral extent of the first layer 910 extending beyond lateral edges of the emitter 901, in certain embodiments the first layer 910 may cover only an upper surface of the emitter 901. FIG. 9C is a top plan schematic view of the emitter 901 and first layer 910 of FIG. 9B after formation of features (e.g., recesses 912) in top and side surfaces of the first layer 910 according to any forming technique as disclosed herein. FIG.

Figure 9D:
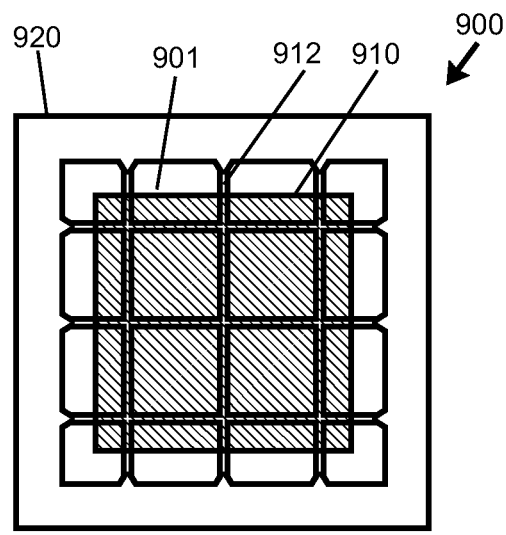
Figure 9E:
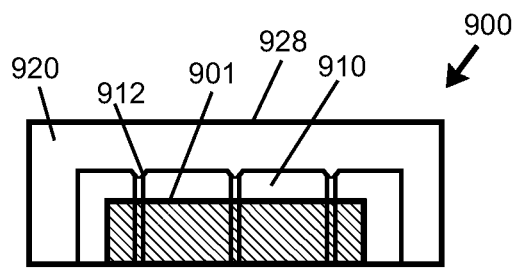

9D is a top plan schematic view of the emitter 910 and first layer 910 of FIG. 9C further overlaid with a second layer 910 containing a second lumiphoric material to form the device 900, and FIG. 9E is a side cross-sectional schematic view of the device 900 of FIG. 9D. Preferably, the first encapsulant material and the second encapsulant material are compositionally different, with the first encapsulant material preferably having a higher index of refraction than the second encapsulant material. An upper surface 928 of the second layer 920 may constitute a light emitting end of the device 900 Additional layers (e.g., additional lumiphoric material containing layers, further encapsulant material layers, and/or lenses, not shown) may be optionally arranged over any of the first, second, and/or third layer 910, 920, 930 in further embodiments.

FIGS. 10A-10D illustrate various elements of an apparatus, and stages of a method, for producing a lighting device according to one embodiment. FIG. 10A is a side cross-sectional schematic view of an electrically activated solid state emitter 1001 overlaid (over a top surface 1002 and side walls 1003, 1004 thereof) with a first layer 1010 containing a first encapsulant material and having a hemispherical surface 1019 prior to formation of textured features in or on the surface 1019. The emitter 1001 and first layer 1010 are positioned under a compression die 1060 including a cavity 1065 having protrusions 1062 and recesses 1061 defined therein to define corresponding recesses and protrusions in the first layer 101 following contact thereof. The compression die 1060 optionally includes channels 1069 for conducting material (e.g., material for forming the first layer 1010) either to or from the cavity 1065. FIG. 10B is a side cross-sectional schematic view of the electrically activated solid state emitter 1001 and first layer 1020 of FIG. 10A following formation of protrusions 1011 and recesses 1012 in the first layer 1010 by application of the compression die 1060 to the outer surface 1019 of the first layer 1010. FIG. 10C is a side cross-sectional schematic view of the emitter 1001 and first layer 1010 of FIG. 10B overlaid with a second layer 1020 (containing a second encapsulant material, optionally further including at least one lumiphoric material), following removal of a hemispherical die 1070 with a cavity 1075 used to shape the second layer 1020. FIG. 10D is a side cross-sectional schematic view of the emitter 1001, first layer 1010, and second layer 1020 of FIG. 10C following formation of a third layer 1030 (containing a third encapsulant material, optionally further including at least one lumiphoric material) over the second layer 1020. An upper surface 1048 of the second layer 1020 may constitute a light emitting surface of the device 1000, or may be overlaid by one or more additional layers or structures (not shown).

Figure 11:
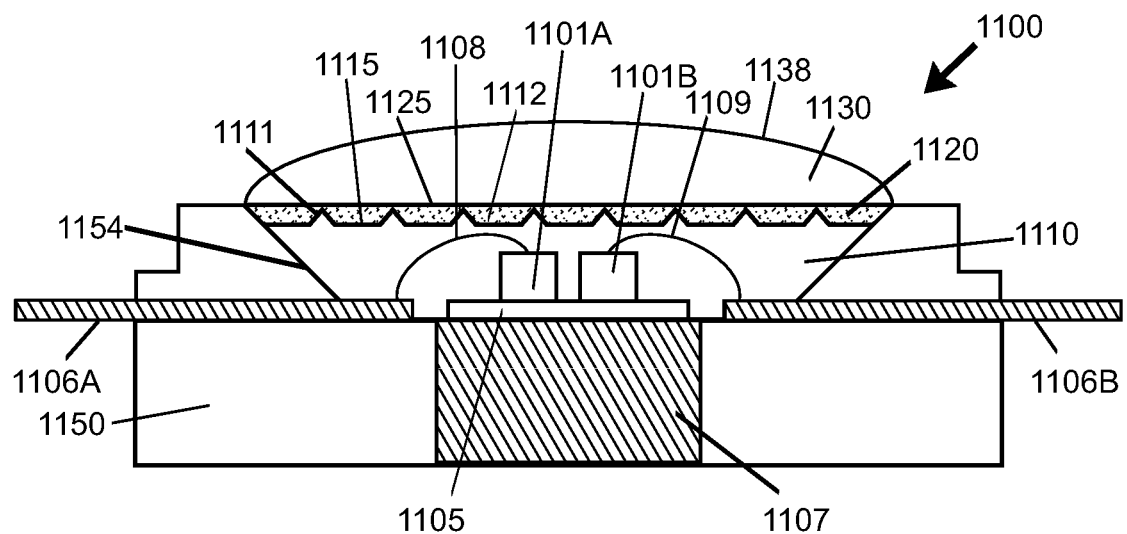
FIG. 11 is a side cross-sectional schematic view of a leadframe-based electrically activated emitter package including first and second electrically activated emitters arranged within a reflector cup and overlaid with a first layer containing a first encapsulant material, a second layer containing a second encapsulant material and a lumiphoric material, and a hemispherical third layer including a third encapsulant material and/or lens, wherein a textured interface is provided between the first layer and the second layer.

Various lighting devices as described herein may be embodied in, or may include, one or more solid state emitter packages. Referring to FIG. 11, an exemplary emitter package 400 may include multiple electrically activated emitters 1101A, 110B (e.g., LED chips manufactured by Cree, Inc., Durham, N.C.) with integral conductive substrates. Although only two solid state emitter chips1101A, 1101B are depicted in the package 1100 according to FIG. 11, it is to be appreciated that any desirable number of solid state emitter chips may be provided in a single package and/or group of solid state emitter packages. The emitters 1101A, 1101B may be vertical devices including anode and cathode contacts on opposing faces, respectively. The solid state emitters 1101A, 1101B may be mounted in a flip-chip configuration, with light emitting upward through substrates of the emitters 1101A, 1101B. Flip-chip mounting is not required; in other embodiments, solid state emitter chips may be mounted with substrate portions thereof proximate to a submount 1105 or other supporting structure. Wirebond connections 1108, 1109 may connect external leads 1106A, 1106B with the emitter chips 1101A, 1101B and/or conductive traces on the submount 1105. The electrical leads 1106A, 1106B may extend laterally outward past side edges of a body structure 1150 containing the submount 1105. The submount 1105 and solid state emitters 1101A, 1101B are arranged in a reflector cup 1154 along an upper surface (or optionally integrated with) the package body structure 1150. The body structure 410 may comprise an electrically insulating material such as a molded polymeric composition and/or a ceramic material. Disposed within a central portion of the body 1150 is a heatsink 1107, which extends between the submount 1105 and a lower surface of the body 410. The heatsink 1107 may be integrally formed with, or joined to, a leadframe encompassing the externally accessible leads 1106A, 1106B.

Within the reflector cup 1154, the solid state emitters 1101A, 1101B are overlaid with a first layer 1110 including a first encapsulant material, overlaid with a second layer 1120 including a second lumiphoric material and optionally at least one lumiphoric material, and overlaid with a third layer 1130 including a third encapsulant material that is shaped as a domed (e.g., hemispherical) lens. An interface 1115 between the first layer 1110 and the second layer 1120 is textured with numerous protruding portions 1111 of the first layer 1110 extending upward into the second layer 1120, but not penetrating through the entire thickness of the second layer 1120. Another interface 1125 between the second layer 1120 and the third layer 1130 is depicted without addition of protrusions or recesses, but it is to be appreciated that such interface 1125 may be optionally textured in any manner as described herein. The third layer includes a rounded light emitting surface 1148 extending above a top edge of the body 1150 as shown in FIG. 11, or may be flat (e.g., as depicted in the embodiment according to FIG. 12). In operation of the package 1100, electric current is applied between the leads 1106A, 1106B to energize the emitters 1101A, 1101B and generate light emissions therefrom. If lumiphoric materials are associated with the emitters 1101A, 1101B and/or contained in one or more of the layers 1110, 1120, 1130, then at least a portion of emissions of at least one of the emitters 1101A, 1101B may be used to stimulate emissions from such lumiphoric materials. Aggregated emissions from the package 1100 may include combined emissions from the first emitter 1101A, second emitter 1101B, and/or lumiphoric material(s) contained in the device 1100. An upper surface 1148 of the third layer 1130 may constitute a light emitting surface of the device 1100, or may be overlaid by one or more additional layers or structures (not shown). A similar solid state emitter package and fabrication details regarding same are provided in U.S. Pat. No. 7,655,957 to Loh, et al., which is incorporated by reference herein.

Figure 12:
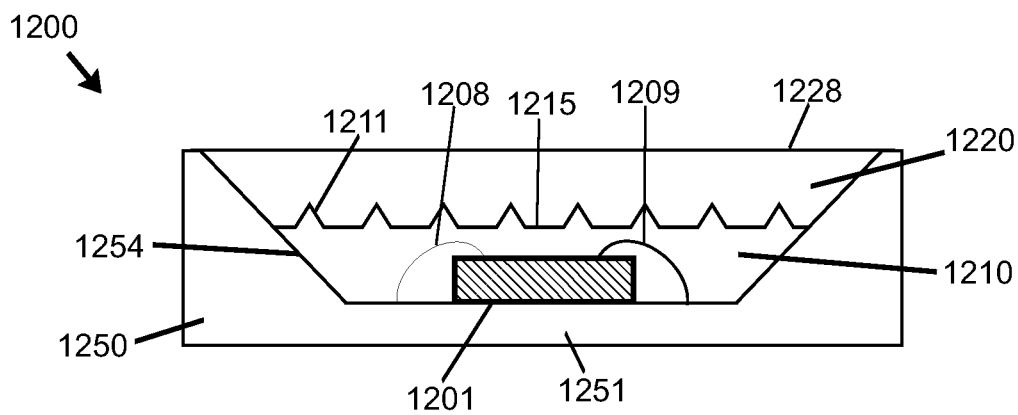
FIG. 12 is a side cross-sectional schematic view of a lighting device including an electrically activated emitter arranged within a reflector cup and overlaid with a first layer containing a first encapsulant material and a second layer containing a second encapsulant material with a substantially flat upper surface, with a textured interface between the first layer and the second layer.

FIG. 12 illustrates a lighting device 1200 according to another embodiment, including an electrically activated emitter 1201 mounted over a floor 1251 of a reflector cup 1254 defined in a body structure 1250, with wirebonds 1208, 1209 providing electrical communication with the emitter 1201. The electrically activated emitter 1201 is overlaid with a first layer 1210 including a first encapsulant material and is overlaid with a second layer 1220 including a second encapsulant material. Preferably, the first encapsulant material and the second encapsulant material are compositionally different, with the first encapsulant material preferably having a higher index of refraction than the second encapsulant material. An interface 1215 between the first and second layers 1210, 1220 is textured with numerous protruding portions 1211 of the first layer 1210 extending upward into the second layer 1220, and with lateral walls of the protrusions 1211 contacting the second layer 1220. An upper (outer) surface 1228 of the second layer 1220 may be flat and/or flush with an upper surface of the body structure 1250, as depicted in FIG. 12. Although not shown, lumiphoric materials and/or additional layers may be further provided.

Figure 13:
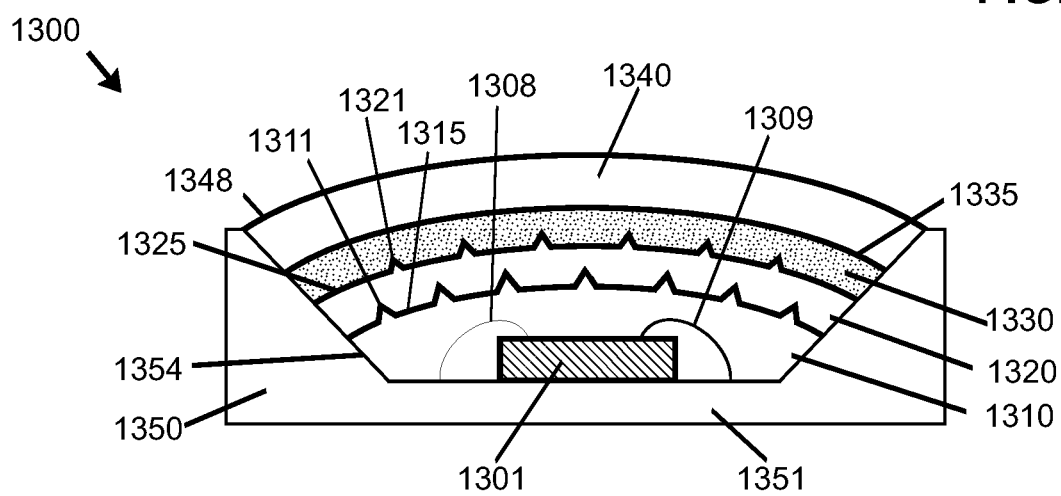
FIG. 13 is a side cross-sectional schematic view of a lighting device including an electrically activated emitter arranged within a reflector cup and overlaid with a first layer containing a first encapsulant material, a second layer containing a second encapsulant material a third layer containing a third encapsulant material, and a fourth layer including a fourth encapsulant material and/or lens provided over the third layer, with a textured interface between the first layer and the second layer, and another textured interface between the second layer and the third layer.

FIG. 13 illustrates a lighting device 1300 according to another embodiment, including an electrically activated emitter 1301 mounted over a floor 1351 of a reflector cup 1354 defined in a body structure 1350, with wirebonds 1308, 1309 providing electrical communication with the emitter 1301. The electrically activated emitter 1301 is overlaid with a first layer 1310 containing a first encapsulant material, overlaid with a second layer 1320 containing a second encapsulant material, overlaid with a third layer 1330 containing a third encapsulant material and optionally containing at least one lumiphoric material, and overlaid with a fourth encapsulant layer (optionally arranged as a lens) arranged over the third layer 1330. A first textured interface 1315 is provided between the first layer 1310 and the second layer 1320, including protruding portions 1311 of the first layer 1310 extending into the second layer 1320. A second textured interface 1325 is provided between the second layer 1320 and the third layer 1320, including protruding portions 1311 of the second layer 1320 extending into the third layer 1330. A further interface 1335 between the third layer 1330 and the fourth layer 1340 is devoid of textural features, but it is to be appreciated that textural features as described herein may be added to such interface 1335 according to alternative embodiments. An upper surface 1348 of the four layer 1340 may constitute a light emitting surface of the device 1300, or may be overlaid by one or more additional layers or structures (not shown).

Figure 14:
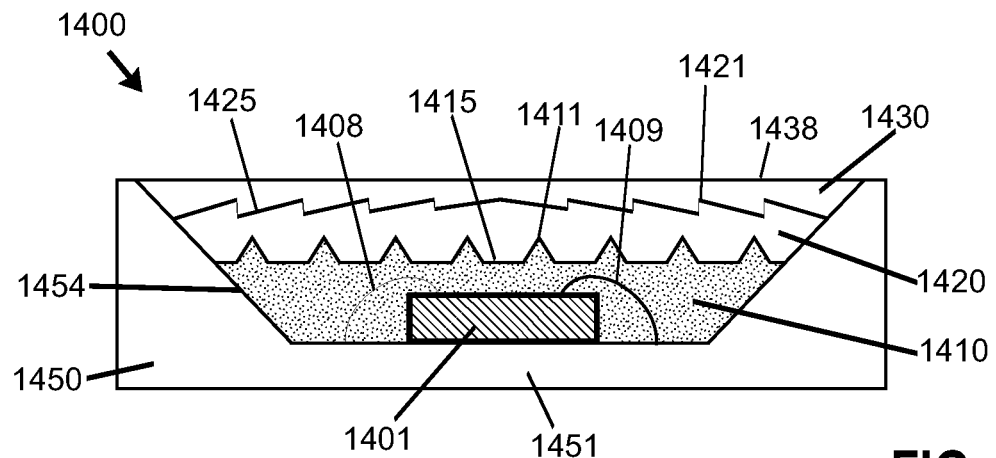
FIG. 14 is a side cross-sectional schematic view of a lighting device including an electrically activated emitter arranged within a reflector cup and overlaid with a first layer containing a first encapsulant material and a lumiphoric material, a second layer containing a second encapsulant material, and a third layer containing a third encapsulant material, with a textured interface between the first layer and the second layer, and another textured interface between the second layer and the third layer arranged as a diverging Fresnel lens.

In certain embodiments, at least one surface of an encapsulant layer may be arranged as a Fresnel lens. For example, FIG. 14 is a side cross-sectional schematic view of a lighting device 1400 including an electrically activated emitter 1401 mounted over a floor 1451 of a reflector cup 1454 defined in a body structure 1450, with wirebonds 1508, 1509 providing electrical communication with the emitter 1401. The electrically activated emitter 1401 is overlaid with a first layer 1410 containing a first encapsulant material and optionally containing at least one lumiphoric material, overlaid with a second layer 1420 containing a second encapsulant material, and overlaid with a third layer 1430 containing a third encapsulant material arranged over the second layer 1420. Preferably, the first, second, and third encapsulant materials are compositionally different, with the first, second, and third encapsulant material preferably having index of refraction values that decline from the first to the second encapsulant material, and further decline from the second to the third encapsulant material. A first textured interface 1415 is provided between the first and second layers 1410, 1420 and includes protruding portions 1411 of the first layer 1410 that extend into the second layer 1420. A second textured interface 1425 is provided between the second layer 1420 and the third layer 1430, and includes protruding portions 1421 of the second layer 1420 that extend into the third layer 1430. The protruding portions 1421 of the second layer 1420 embody a diverging Fresnel lens arranged to emit a wide beam. An upper surface 1448 of the third layer 1430 may constitute a light emitting surface of the device 1400, or may be overlaid by one or more additional layers or structures (not shown).

Figure 15:
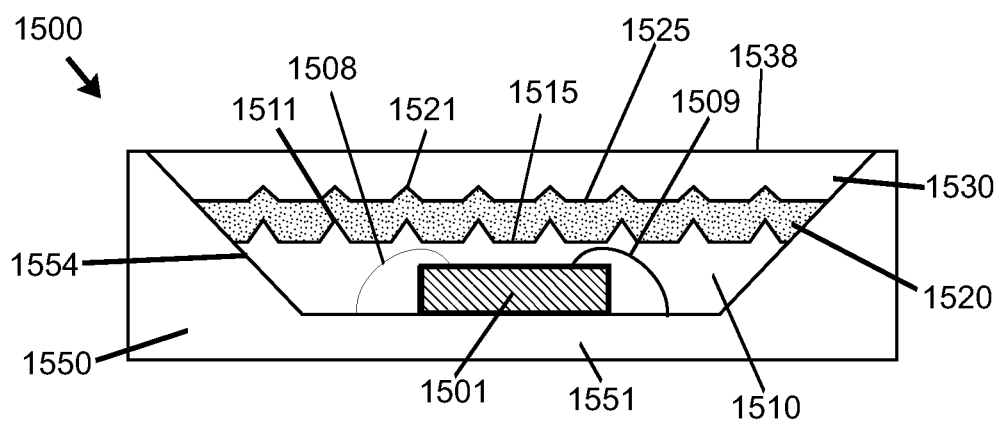
FIG. 15 is a side cross-sectional schematic view of a lighting device including a first and a second electrically activated emitter arranged within a reflector cup and overlaid with a first layer containing a first encapsulant material, a second layer containing a second encapsulant material and a lumiphoric material, and a third layer containing a third encapsulant material and/or lens, with a textured interface between the first layer and the second layer, and with a textured interface between the second layer and the third layer.
Figure 16:
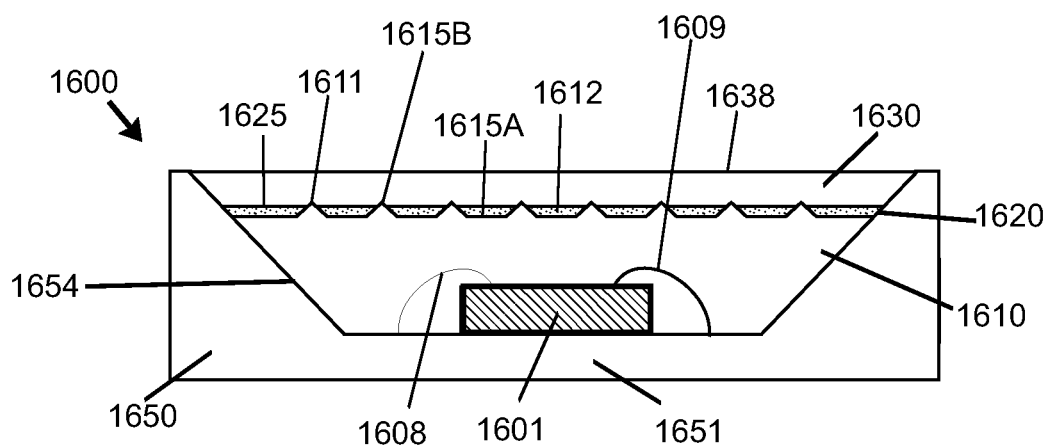
FIG. 16 is a side cross-sectional schematic view of a lighting device including a first and a second electrically activated emitter arranged within a reflector cup and overlaid with a first layer containing a first encapsulant material, a second layer containing a second lumiphoric material and a lumiphoric material, and a third layer containing a third encapsulant material, with a textured interface between the first layer and the second layer, and with a textured interface between the second layer and the third layer.
Figure 17:
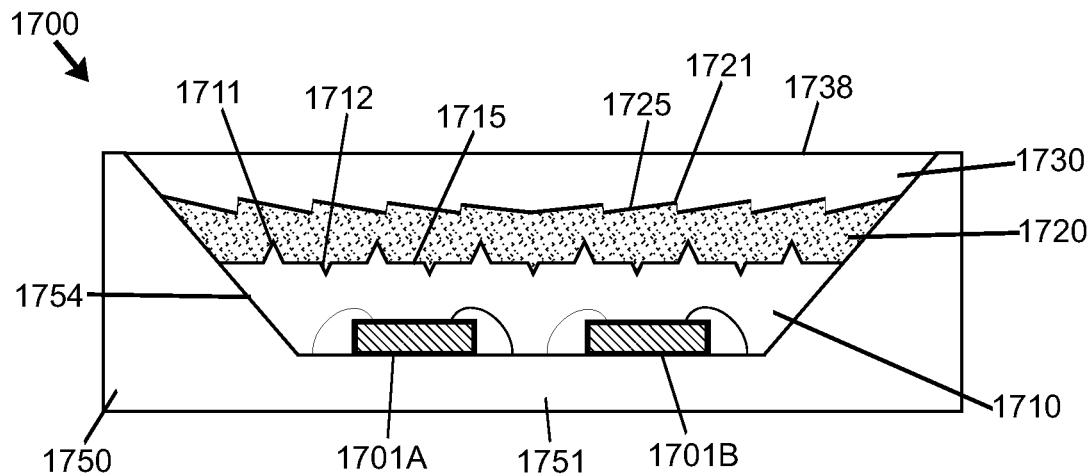
FIG. 17 is a side cross-sectional schematic view of a lighting device including a first and a second electrically activated emitter arranged within a reflector cup and overlaid with a first layer containing a first encapsulant material, a second layer containing a second encapsulant material and a lumiphoric material, and a third layer containing a third encapsulant material, with a textured interface between the first layer and the spacer layer including protruding portions of the first layer and recesses defined in the first layer, and with a textured interface between the second layer and the encapsulant layer including protruding portions of the second layer arranged as a converging Fresnel lens.

In certain embodiments, lighting devices with multiple encapsulant material layers may include lumiphor-containing layers that are spatially segregated from electrically activated emitters, such as illustrated in FIGS. 15-17.

FIG. 15 is a side cross-sectional schematic view of a lighting device 1500 including an electrically activated emitter 1501 mounted over a floor 1551 of a reflector cup 1554 defined in a body structure 1550, with wirebonds 1508, 1509 providing electrical communication with the emitter 1501. The emitter 1501 is overlaid with a first layer 1510 containing a first encapsulant material, overlaid with a second layer 1520 containing a second encapsulant material and optionally containing at least one lumiphoric material, and is overlaid with a third layer 1530 containing a third lumiphoric material. 1430 containing a third encapsulant material arranged over the second layer 1420. Preferably, the first, second, and third encapsulant materials are compositionally different, with the first, second, and third encapsulant material preferably having index of refraction values that decline from the first to the second encapsulant material, and further decline from the second to the third encapsulant material. A first textured interface 1515 between the first layer 1510 and the second layer 1520 includes protruding portions 1511 of the first layer 1510 that extend outward (upward) into the second layer 1520. A second textured interface 1525 between the second layer 1520 and the third layer 1530 includes protruding portions of the second layer 1521 that extend outward (upward) into the third layer 1530. An upper surface 15438 of the encapsulant and/or lens material 1440 may constitute a light emitting surface of the device 1400, or may be overlaid by one or more additional layers or structures (not shown).

FIG. 16 illustrates a lighting device 1600 including an electrically activated emitter 1601 mounted over a floor 1651 of a reflector cup 1654 defined in a body structure 1650, with wirebonds 1608, 1609 providing electrical communication with the emitter 1601. The emitter is overlaid with a first layer 1610 including a first encapsulant material, overlaid with a second layer 1620 including a second encapsulant material and optionally at least one lumiphoric material, and overlaid with a third layer 1630 containing a third encapsulant material. Protruding portions 1611 of the first layer 1610 extend through the second layer 1620 into the third layer 1630, providing an interface 1615A between the first layer 1610 and the second layer 1620, and providing another interface 1615B between the first layer 1610 and the third layer 1630. In this manner, lateral wall portions of the protrusions 1611 contact both the second layer 1620 and the third layer 1630. The second layer 1620 may include discontinuous portions arranged between the protrusions 1611 of the first layer 1610. The second layer 1620 may further include portions containing lumiphoric materials of different concentrations and/or different compositions, such as in discontinuous regions between the protrusions 1611. An upper surface 1638 of the third layer 1630 may constitute a light emitting surface of the device 1600, or may be overlaid by one or more additional layers or structures (not shown).

Figure 18:
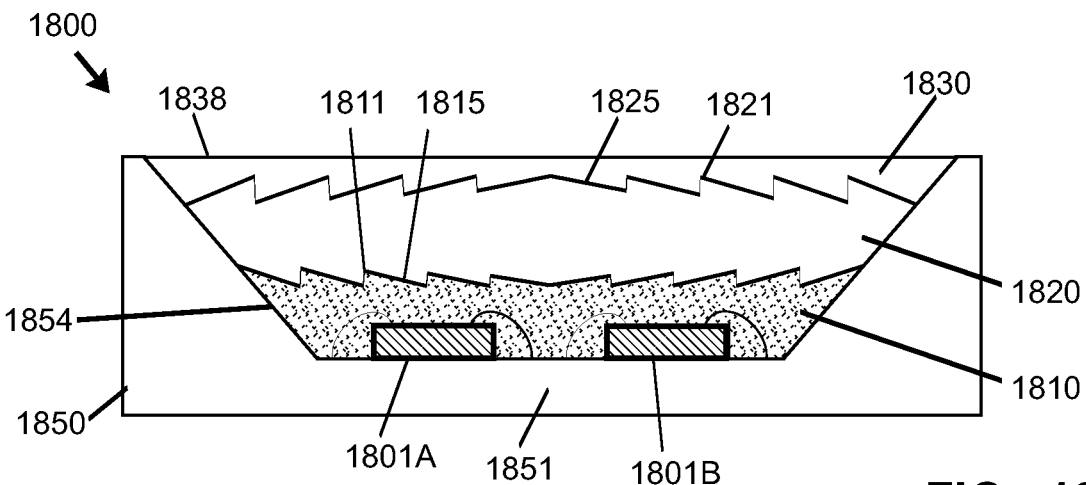
FIG. 18 is a side cross-sectional schematic view of a lighting device including a first and a second electrically activated emitter arranged within a reflector cup and overlaid with a first layer containing a first encapsulant material and a lumiphoric material, a second layer containing a second encapsulant material, and a third layer containing a third encapsulant material and/or lens, with a textured interface between the first layer and the second layer including protruding portions of the first layer arranged as a converging Fresnel lens, and with a textured interface between the second layer and the third layer comprising a diverging Fresnel lens.

In certain embodiments, lighting devices may include multiple electrically activated emitters and may include one or more lenses (e.g., Fresnel lenses), such as shown in FIGS. 17-18.

FIG. 17 is a side cross-sectional schematic view of a lighting device 1700 including electrically activated emitters 1701A, 1701B mounted over a floor 1751 of a reflector cup 1754 defined in a body structure 1750, with wirebonds providing electrical communication with the emitters 1701A, 1701B. The emitters 1701A, 1701B are overlaid with a first layer 1710 containing a first encapsulant material, overlaid with a second layer 1720 containing a second encapsulant material and optionally containing at least one lumiphoric material, and overlaid with a third layer 1730 containing a third encapsulant material. A textured interface 1715 is provided between the first layer 1710 and the second layer 1720, including protrusions 1711 and recesses 1712. Another textured interface 1725 is provided between the second layer 1720 and the third layer 1730, including protruding portions 1721 of the second layer 1720 arranged as a converging Fresnel lens. Lateral edges of the layers 1710, 1720, 1730 contact walls of the reflector cup 1754. An upper surface 1738 of the third layer 1730 may constitute a light emitting surface of the device 1700, or may be overlaid by one or more additional layers or structures (not shown).

FIG. 18 is a side cross-sectional schematic view of a lighting device 1800 including electrically activated emitters 1801A, 1801B mounted over a floor 1851 of a reflector cup 1854 defined in a body structure 1850, with wirebonds providing electrical communication with the emitters 1801A, 1801B. The emitters 1801A, 1801B are overlaid with a first layer 1810 containing a first encapsulant material and optionally including at least one lumiphoric material, overlaid with a second layer 1820 including a second encapsulant material, and overlaid with a third layer 1830 including a third encapsulant material. A first textured interface 1815 between the first layer 1810 and the second layer 1840 includes protruding portions 1811 of the first layer 1810 and is arranged as a converging Fresnel lens. A second textured interface 1825 between the second layer 1820 and the third layer 1830 includes protruding portions 1821 of the second layer 1820 is arranged as a diverging Fresnel lens. Lateral edges of the layers 1810, 1820, 1830 contact walls of the reflector cup 1854. An upper surface 1838 of the third layer 1830 may constitute a light emitting surface of the device 1800, or may be overlaid by one or more additional layers or structures (not shown).

Figure 19:
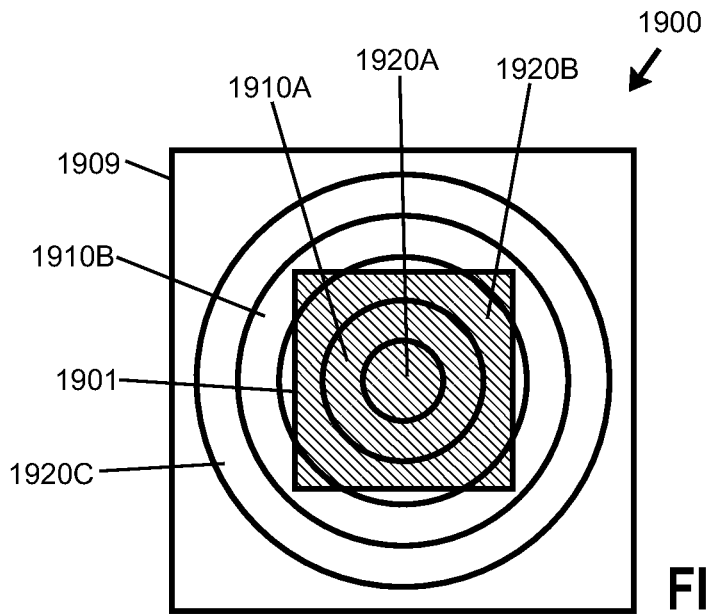
FIG. 19 is a top plan schematic view of a lighting device including an electrically activated emitter arranged over a substrate, with the emitter being overlaid with a first layer containing a first encapsulant material, and a second layer containing a second encapsulant material, wherein portions of the first and second layers are concentrically arranged.

FIG. 19 is a top plan schematic view of a lighting device 1900 including an electrically activated emitter 1901 arranged over a substrate or other mounting structure 1909, with the emitter 1901 being overlaid with a first layer 1910 (encompassing regions 1910A, 1910B) containing a first encapsulant material, and overlaid with a second layer 1920 (encompassing regions 1920A, 1920B, 1920C) containing a second encapsulant material, wherein portions of the first and second layer are concentrically arranged. That is, a central portion 1920A of the second layer is arranged within a near-central portion 1910A of the first layer, with the remaining portions 1920B, 1910B, 1920C being sequentially arranged as concentric circles. Although only two encapsulant layers 1910, 1920 are illustrated in FIG. 19, it is to be appreciated that more than two such layers could be provided in alternative embodiments. One or more of the encapsulant layers 1910, 1920 may include one or more lumiphoric materials.

In certain embodiments, consecutively arranged encapsulant layers may differ in shape and/or size.

Figure 20:
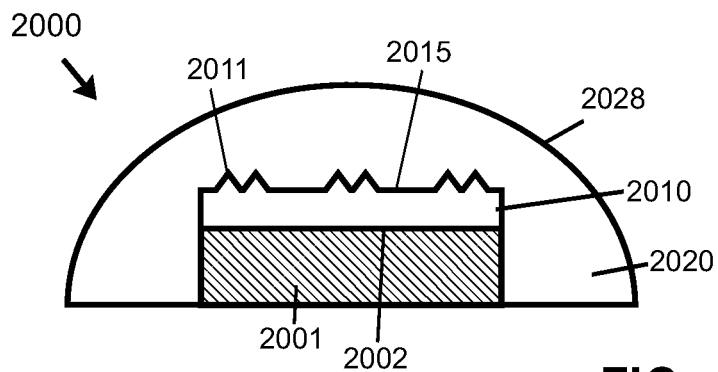
FIG. 20 is a side cross-sectional schematic view of a lighting device including an electrically activated emitter overlaid with a predominantly flat first layer containing a first encapsulant material, and overlaid with a curved or hemispherical second layer containing a second encapsulant material, with a textured interface between the first layer and the second layer.

FIG. 20 illustrates a lighting device 2000 including a predominantly flat first layer 2010 including a first encapsulant material overlying an upper surface 2002 of an electrically activated emitter 2001, and a curved or hemispherical second layer 2020 including a second encapsulant layer overlying the first layer 2010. A textured interface 2015 (e.g., including protruding portions 2011 of the first layer 2010 extending into the second layer 2020) is provided between the first and second layers 2010, 2020. Preferably, the first encapsulant material and the second encapsulant material are compositionally different, with the first encapsulant material preferably having a higher index of refraction than the second encapsulant material. A distal outer surface 2028 of the second layer 2020 may constitute a light emitting surface of the device 2000. Additional layers (e.g., additional lumiphoric material containing layers, further encapsulant materials, and/or lenses, not shown) may be optionally arranged over the first layer 2010 and/or the second layer 2020 in further embodiments.

Figure 21:
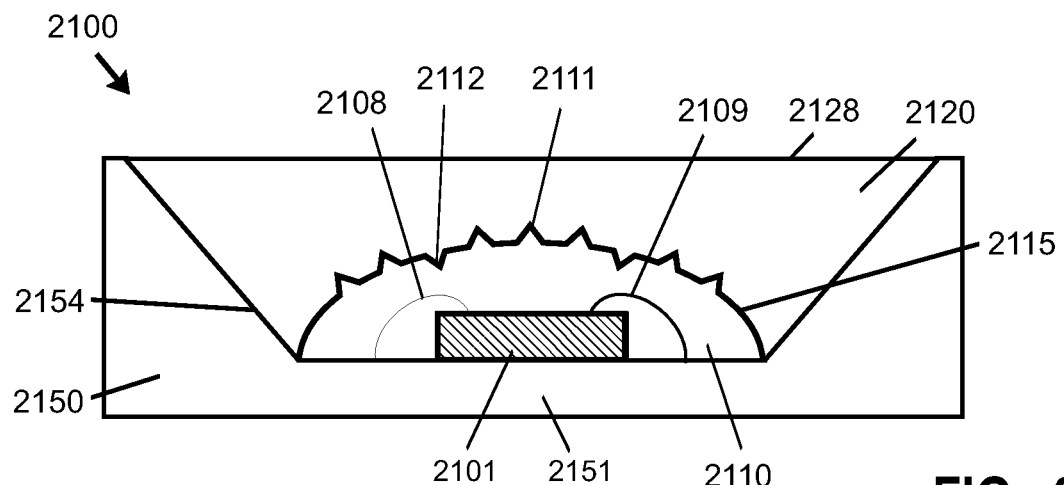
FIG. 21 is a side cross-sectional schematic view of a lighting device including an electrically activated emitter arranged within a reflector cup and overlaid with a curved or hemispherical first layer containing a first encapsulant material, and overlaid with a second layer containing a second encapsulant material having a predominantly flat upper surface, with a textured interface between the first layer and the second layer.

FIG. 21 illustrates a lighting device 2100 according to another embodiment, including an electrically activated emitter 2101 mounted over a floor 2151 of a reflector cup 2154 defined in a body structure 2150, with wirebonds 2108, 2109 providing electrical communication with the emitter 2101. The electrically activated emitter 2101 is overlaid with a first layer 2110 including a first encapsulant material and overlaid with a second layer 2120 including a second encapsulant material. Preferably, the first encapsulant material and the second encapsulant material are compositionally different, with the first encapsulant material preferably having a higher index of refraction than the second encapsulant material. An interface 2115 between the first and second layers 2110, 2120 is textured with numerous protruding portions 2111 of the first layer 2110 extending upward into the second layer 2120, and with recesses 2112 defined in the first layer 2110, such that lateral walls of the protrusions 2111 and recesses 2112 contact the second layer 2120. The first layer 2110 is curved or hemispherical in shape, whereas the second layer has a flat upper surface. Preferably both the first layer 2110 and the second layer 2120 contact at least portions of the reflector cup 2154. An upper (outer) surface 2128 of the second layer 2120 may be flat and/or flush with an upper surface of the body structure 2150, as depicted in FIG. 21, and may define a light emitting end of the device 2100 or may be covered with one or more additional layers or structures (not shown). Although not shown, lumiphoric materials and/or additional layers may be further provided.

Figure 22:
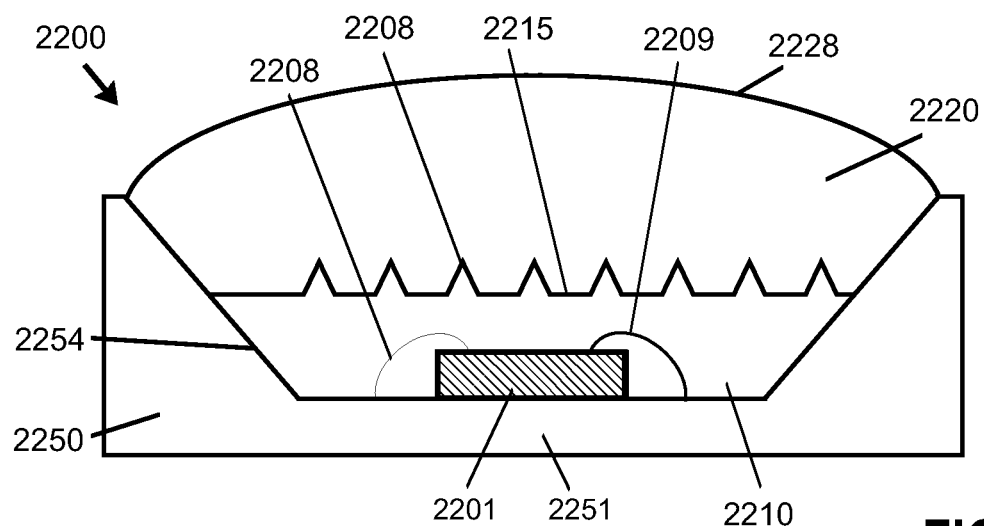
FIG. 22 is a side cross-sectional schematic view of a lighting device including an electrically activated emitter arranged within a reflector cup and overlaid with a predominantly flat first layer containing a first encapsulant material, and overlaid with a second layer containing a second encapsulant material having a curved or hemispherical shape, with a textured interface between the first layer and the second layer.

FIG. 22 illustrates a lighting device 2200 according to another embodiment, including an electrically activated emitter 2201 mounted over a floor 2251 of a reflector cup 2254 defined in a body structure 2250, with wirebonds 2208, 2209 providing electrical communication with the emitter 2201. The electrically activated emitter 2201 is overlaid with a first layer 2210 including a first encapsulant material and overlaid with a second layer 2220 including a second encapsulant material. Preferably, the first encapsulant material and the second encapsulant material are compositionally different, with the first encapsulant material preferably having a higher index of refraction than the second encapsulant material. An interface 2215 between the first and second layers 2210, 2220 is textured with numerous protruding portions 2211 of the first layer 2210 extending upward into the second layer 2220, such that lateral walls of the protrusions 2211 contact the second layer 2220. The first layer 2210 has a predominantly flat shape aside from the textured surface thereof, whereas the second layer 2220 is curved or hemispherical in shape. Preferably both the first layer 2210 and the second layer 2220 contact at least portions of the reflector cup 2254. An upper (outer) surface 2228 of the second layer 2220 may extend outward above an upper surface of the body structure 2250, as depicted in FIG. 22, and may define a light emitting end of the device 2200, or may be covered with one or more additional layers or structures (not shown). Although not shown, lumiphoric materials and/or additional layers may be further provided.

Certain embodiments of the invention are directed to methods for illuminating an object, a space, or an environment, utilizing at least one lighting device as described herein.

Embodiments as disclosed herein may provide one or more of the following beneficial technical effects: enhanced adhesion between layers (e.g., encapsulant layers) of a lighting device; enhanced control of optical properties (including, but not limited, focus and/or directionality) of lighting devices including encapsulant materials; enhanced light extraction from lighting device including encapsulant materials; enhanced color mixing of a lighting device including encapsulant materials, thereby permitting a lighting device (e.g., LED lighting device) to be tailored to a selected end use.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Various combinations and sub-combinations of the structures described herein are contemplated and will be apparent to a skilled person having knowledge of this disclosure. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its scope and including equivalents of the claims.

What is claimed is:

1. A lighting device comprising:
   at least one electrically activated emitter;
   a first layer comprising a first encapsulant material overlying at least a portion of the at least one electrically activated emitter and arranged to receive emissions of the at least one electrically activated emitter; and
   a second layer comprising a second encapsulant material overlying at least a portion of the first layer and arranged to receive emissions of the at least one electrically activated emitter, wherein the second encapsulant material is compositionally different from the first encapsulant material;
   wherein an interface between the first layer and the second layer comprises at least one of the following features (i) and (ii):
   (i) at least one outwardly protruding portion of the first layer that includes at least one protruding portion lateral wall of the first layer arranged in contact with the second layer, wherein the at least one protruding portion of the first layer comprises a height of at least 5 micrometers; and
   (ii) at least one recess defined in the first layer that is bounded by at least one recess lateral wall of the first layer arranged in contact with the second layer, wherein the at least one recess defined in the first layer comprises a depth of at least 5 micrometers; and
   wherein the lighting device comprises at least one of the following features (a) to (d):
   (a) a lumiphoric material-containing layer is arranged between at least portions of the first layer and the second layer;
   (b) the first layer is arranged in contact with the at least one electrically activated emitter or is arranged in contact with a lumiphor-containing layer that contacts the at least one electrically activated emitter;
   (c) the second layer overlies less than an entirety of the first layer; and
   (d) a third layer overlies at least a portion of the second layer, wherein the third layer comprises a third encapsulant material that is compositionally different from the second encapsulant material, and wherein an interface between the second layer and the third layer comprises at least one of the following features (I) and (II): (I) at least one outwardly protruding portion of the second layer that includes at least one protruding portion lateral wall of the second layer arranged in contact with the third layer, wherein the at least one protruding portion of the second layer comprises a height of at least 5 micrometers; and (II) at least one recess defined in the second layer that is bounded by at least one recess lateral wall of the second layer arranged in contact with the third layer, wherein the at least one recess defined in the second layer comprises a depth of at least 5 micrometers.

2. A lighting device according to claim 1, wherein the interface between the first layer and the second layer comprises feature (i).

3. A lighting device according to claim 1, wherein the interface between the first layer and the second layer comprises feature (ii).

4. A lighting device according to claim 3, wherein the at least one recess does not penetrate through an entire thickness of the first layer.

5. A lighting device according to claim 1, wherein the interface between the first layer and the second layer comprises a plurality of outwardly protruding portions of the first layer each having a height of at least 5 micrometers or comprises a plurality of recesses defined in the first layer with each recess of the plurality of recesses in the first layer comprising a depth of at least 5 micrometers.

6. A lighting device according to claim 1, comprising at least three outwardly protruding portions of the first layer or comprising at least three recesses defined in the first layer, wherein gaps between adjacent outwardly protruding portions of the at least three outwardly protruding portions, or gaps between adjacent recesses of the at least three recesses, are substantially equal in length.

7. A lighting device according to claim 1, wherein the interface between the first layer and the second layer comprises multiple outwardly protruding portions of the first layer having heights that differ relative to one another, or comprises multiple recesses defined in the first layer having depths that differ relative to one another.

8. A lighting device according to claim 1, wherein the interface between the first layer and the second layer is arranged as a collimating lens, a focusing lens, a diverging lens, and a Fresnel lens.

9. A lighting device according to claim 1, wherein at least one of the first layer and the second layer is devoid of any lumiphoric material.

10. A lighting device according to claim 1, wherein the first layer comprises a material having first index of refraction, and the second layer comprises a material having second index of refraction that is less than the first index of refraction.

11. A lighting device according to claim 1, wherein at least one of the first layer and the second layer comprises at least one light scattering material, and wherein at least one of presence, concentration, amount, average particle size, and distribution of the at least one light scattering material differs between the first layer and the second layer.

12. A lighting device according to claim 1, further comprising a third layer overlying at least a portion of the second layer, wherein the third layer comprise a third encapsulant material that is compositionally different from the second encapsulant material, and wherein an interface between the second layer and the third layer comprises at least one of the following features (I) and (II): (I) at least one outwardly protruding portion of the second layer that includes at least one protruding portion lateral wall of the second layer arranged in contact with the third layer, wherein the at least one protruding portion of the second layer comprises a height of at least 5 micrometers; and (II) at least one recess defined in the second layer that is bounded by at least one recess lateral wall of the second layer arranged in contact with the third layer, wherein the at least one recess defined in the second layer comprises a depth of at least 5 micrometers.

13. A lighting device according to claim 12, wherein the interface between the second layer and the third layer is arranged as any of a collimating lens, a focusing lens, a diverging lens, and a Fresnel lens.

14. A lighting device according to claim 1, further comprising a lumiphoric material-containing layer arranged between at least portions of the first layer and the second layer.

15. A lighting device according to claim 1, wherein the first layer is arranged in contact with the at least one electrically activated emitter or is arranged in contact with a lumiphor-containing layer that contacts the at least one electrically activated emitter.

16. A lighting device according to claim 1, wherein the first layer is spatially segregated from the at least one electrically activated emitter.

17. A lighting device according to claim 1, further comprising at least one lateral bounding element contacting an edge portion of a least one of the first layer and the second layer.

18. A lighting device according to claim 1, wherein the at least one electrically activated emitter comprises at least one electrically activated solid state emitter.

19. A lighting device according to claim 1, wherein the at least one electrically activated solid state emitter is arranged within a reflector cup contacting an edge portion of at least one of the first layer and the second layer.

20. A lighting device according to claim 1, wherein the second layer is continuous in character and is devoid of unconnected segments.

21. A lighting device according to claim 1, wherein the second layer overlies less than an entirety of the first layer.

22. A lighting device according to claim 1, comprising at least one protruding portion lateral wall that is angled in a direction that is non-perpendicular to a light emitting surface of the at least one electrically activated emitter, or comprising at least one recess lateral wall is angled in a direction that is non-perpendicular to a light emitting surface of the at least one electrically activated emitter.

23. A lighting device according to claim 1, wherein the interface between the first layer and the second layer comprises at least one of the following features (A) and (B):
 (A) a plurality of outwardly protruding portions of the first layer that are arranged in an array or are concentrically arranged, wherein each outwardly protruding portion includes at least one protruding portion lateral wall of the first layer arranged in contact with the second layer, and wherein each protruding portion of the first layer comprises a height of at least 5 micrometers; and
 (B) a plurality of recesses defined in the first layer and that are arranged in an array or are concentrically arranged, wherein each recess is bounded by at least one recess lateral wall of the first layer arranged in contact with the second layer, and wherein the at least one recess defined in the first layer comprises a depth of at least 5 micrometers.

24. A lighting device according to claim 1, wherein the interface between the first layer and the second layer comprises at least one of the following features (a) and (b):
 (a) at least one outwardly protruding portion of the first layer that includes at least one protruding portion lateral wall of the first layer arranged in contact with the second layer, wherein the at least one protruding portion of the first layer comprises a height of at least 10 micrometers; and
 (b) at least one recess defined in the first layer that is bounded by at least one recess lateral wall of the first layer arranged in contact with the second layer, wherein the at least one recess defined in the first layer comprises a depth of at least 10 micrometers.

25. A lighting device comprising:
at least one electrically activated emitter;
a first layer comprising at least one first encapsulant material arranged to receive light generated by at least one electrically activated emitter; and
a second layer comprising at least one second encapsulant material overlying the first layer and arranged to receive emissions from the first layer, wherein the second encapsulant material is compositionally different from the first encapsulant material;
wherein at least one of (a) at least one surface of the first layer, and (b) a surface of the second layer proximate to the first layer, comprises at least one of the following items (i) to (iv):
 (i) at least one outwardly protruding portion comprising a height of at least 5 micrometers;
 (ii) at least one recess comprising a depth of at least 5 micrometers;
 (iii) at least three features that are regularly spaced relative to one another with substantially equal gaps between adjacent features, wherein the at least three features that are regularly spaced include at least one of recesses and outwardly protruding portions; and
 (iv) at least three features comprising regularized height or depth that include at least one of recesses and outwardly protruding portions, including variation in height or depth of less than 20% among the at least three features comprising regularized height or depth; and
wherein the lighting device comprises at least one of the following features (A) to (D):
 (A) a lumiphoric material-containing layer is arranged between at least portions of the first layer and the second layer;
 (B) the first layer is arranged in contact with the at least one electrically activated emitter or is arranged in contact with a lumiphor-containing layer that contacts the at least one electrically activated emitter;
 (C) the second layer overlies less than an entirety of the first layer; and
 (D) a third layer overlies at least a portion of the second layer, wherein the third layer comprises a third encapsulant material that is compositionally different from the second encapsulant material, and wherein an interface between the second layer and the third layer comprises at least one of the following features (I) and (II): (I) at least one outwardly protruding portion of the second layer that includes at least one protruding portion lateral wall of the second layer arranged in contact with the third layer, wherein the at least one protruding portion of the second layer comprises a height of at least 5 micrometers; and (II) at least one recess defined in the second layer that is bounded by at least one recess lateral wall of the second layer arranged in contact with the third layer, wherein the at least one recess defined in the second layer comprises a depth of at least 5 micrometers.

26. A lighting device according to claim 25, wherein at least one of (a) the at least one surface of the first layer, and (b) the surface of the second layer proximate to the first layer, comprises at least one of items (i) and (ii).

27. A lighting device according to claim 25, wherein at least one of (a) the at least one surface of the first layer, and (b) the surface of the second layer proximate to the first layer, comprises at least one of items (iii) and (iv).

28. A lighting device according to claim 25, wherein the first layer is arranged in contact with the second layer.

29. A lighting device according to claim 25, wherein the first layer is spatially segregated from the at least one electrically activated emitter.

30. A lighting device according to claim 25, wherein at least one of the first layer and the second layer comprises at least one lumiphoric material.

31. A lighting device according to claim 25, wherein at least one of (a) the at least one surface of the first layer, and (b) the surface of the second layer proximate to the first layer, comprises any of a collimating lens, a focusing lens, a diverging lens, and a Fresnel lens.

32. A method for fabricating a lighting device according to claim 25, the method comprising:
   depositing a first layer comprising a first encapsulant material over at least a portion of at least one electrically activated emitter, with the first encapsulant material arranged to receive emissions of the at least one electrically activated emitter;
   forming at least one of the following items (i) to (iv) in or on the first layer:
   (i) at least one outwardly protruding portion comprising a height of at least 5 micrometers;
   (ii) at least one recess defined in the first layer comprising a depth of at least 5 micrometers;
   (iii) at least three features that are regularly spaced relative to one another with substantially equal gaps between adjacent features, wherein the at least three features include at least one of recesses in the first layer and outwardly protruding portions of the first layer; and
   (iv) at least three features comprising regularized height or depth that include at least one of recesses in the first layer and outwardly protruding portions of the first layer, including variation in height or depth of less than 20% among the at least three features; and
   depositing a second layer comprising a second encapsulant material over at least a portion of the first layer and arranged to receive emissions of the at least one electrically activated emitter;
   wherein the lighting device comprises at least one of the following features (A) to (D):
   (A) a lumiphoric material-containing layer is arranged between at least portions of the first layer and the second layer;
   (B) the first layer is arranged in contact with the at least one electrically activated emitter or is arranged in contact with a lumiphor-containing layer that contacts the at least one electrically activated emitter;
   (C) the second layer overlies less than an entirety of the first layer; and
   (D) a third layer overlies at least a portion of the second layer, wherein the third layer comprises a third encapsulant material that is compositionally different from the second encapsulant material, and wherein an interface between the second layer and the third layer comprises at least one of the following features (I) and (II): (I) at least one outwardly protruding portion of the second layer that includes at least one protruding portion lateral wall of the second layer arranged in contact with the third layer, wherein the at least one protruding portion of the second layer comprises a height of at least 5 micrometers; and (II) at least one recess defined in the second layer that is bounded by at least one recess lateral wall of the second layer arranged in contact with the third layer, wherein the at least one recess defined in the second layer comprises a depth of at least 5 micrometers.

33. A method according to claim 32, wherein the forming step comprises forming (i) at least one outwardly protruding portion of the first layer that includes at least one protruding portion lateral wall of the first layer, wherein the at least one protruding portion of the first layer comprises a height of at least 5 micrometers.

34. A method according to claim 32, wherein the forming step comprises forming (ii) at least one recess defined in the first layer that is bounded by at least one recess lateral wall of the first layer arranged in contact with the second layer, wherein the at least one recess defined in the first layer comprises a depth of at least 5 micrometers.

35. A method according to claim 32, wherein the forming step comprises forming (iii) at least three features that are regularly spaced relative to one another with substantially equal gaps between adjacent features, wherein the at least three features include at least one of recesses in the first layer and outwardly protruding portions of the first layer.

36. A method according to claim 32, wherein the forming step comprises forming (iv) at least three features comprising regularized height or depth that include at least one of recesses in the first layer and outwardly protruding portions of the first layer, including variation in height or depth of less than 20% among the at least three features.

37. A method according to claim 32, wherein said forming step comprises applying a compression mold to the first layer, at least partially curing the first layer, and removing the mold, prior to deposition of the second layer.

38. A method according to claim 32, comprising at least partially curing the first layer prior to the forming step.

39. A method according to claim 38, wherein said forming step comprises supplying a stream of pressurized fluid to the first layer to effectuate removal of a portion of the first layer.

40. A method according to claim 38, wherein said forming step comprises supplying to the first layer a chemical reactant adapted to react with the first layer to effectuate removal of a portion of the first layer.

41. A method according to claim 38, wherein said forming step comprises supplying laser energy to the first layer to effectuate removal of a portion of the first layer.

42. A method according to claim 38, wherein said forming step comprises cutting the first layer to effectuate removal of a portion of the first layer.

43. A method according to claim 32, wherein said forming step comprises applying a mask over at least a portion of the first layer and supplying material or energy to the first layer through at least one opening defined in the mask.

44. A method according to claim 32, further comprising mounting the at least one electrically activated emitter to at least one of (i) a substrate and (ii) a reflector, prior to the deposition of the first layer.

45. A method according to claim 32, further comprising depositing a lumiphoric material-containing layer over at least a portion of the first layer prior to the deposition of the second layer.

46. A method according to claim 32, wherein at least one of the first layer and the second layer is applied in liquid form.

* * * * *